(12) United States Patent
Itaya et al.

(10) Patent No.: US 8,735,288 B2
(45) Date of Patent: May 27, 2014

(54) SEMICONDUCTOR DEVICE AND INFORMATION PROCESSING SYSTEM INCLUDING THE SAME

(71) Applicant: Elpida Memory, Inc., Tokyo (JP)

(72) Inventors: Satoshi Itaya, Tokyo (JP); Kayoko Shibata, Tokyo (JP); Shoji Azuma, Tokyo (JP); Akira Ide, Tokyo (JP)

( * ) Notice: Subject to any disclaimer, the term of this patent is extended or adjusted under 35 U.S.C. 154(b) by 0 days.

(21) Appl. No.: 14/082,138

(22) Filed: Nov. 16, 2013

(65) Prior Publication Data

US 2014/0073127 A1  Mar. 13, 2014

Related U.S. Application Data

(63) Continuation of application No. 13/720,265, filed on Dec. 19, 2012, now Pat. No. 8,604,621, which is a continuation of application No. 12/923,789, filed on Oct. 7, 2010, now Pat. No. 8,350,389.

(30) Foreign Application Priority Data

Oct. 9, 2009   (JP) ................................. 2009-235491

(51) Int. Cl.
*H01L 21/44* (2006.01)

(52) U.S. Cl.
USPC .................. 438/667; 257/E23.011; 257/774; 438/629; 438/637

(58) Field of Classification Search
CPC .............. H01L 23/485; H01L 23/481; H01L 23/49811; H01L 21/44
USPC .......... 257/E23.011, 621, 698, 700, 737, 774, 257/775, 777, 784; 438/629, 637, 640, 667, 438/668, 672, 675, 713, 978; 174/255, 262
See application file for complete search history.

(56) References Cited

U.S. PATENT DOCUMENTS

| 5,466,893 | A | 11/1995 | Nakatani et al. ............... 174/261 |
|---|---|---|---|
| 6,239,495 | B1 | 5/2001 | Sakui et al. .................... 257/777 |
| 6,303,879 | B1 * | 10/2001 | Burkhart ........................ 174/261 |
| 6,448,661 | B1 * | 9/2002 | Kim et al. ...................... 257/777 |
| 6,624,506 | B2 | 9/2003 | Sasaki et al. .................. 257/686 |
| 7,115,972 | B2 | 10/2006 | Dotta et al. .................... 257/621 |
| 7,276,780 | B2 * | 10/2007 | Dotta et al. .................... 257/621 |
| 7,339,277 | B2 * | 3/2008 | Shioga et al. .................. 257/778 |
| 7,405,366 | B2 | 7/2008 | Shioga et al. .................. 174/260 |
| 7,454,833 | B2 | 11/2008 | Audet et al. ..................... 29/846 |
| 7,531,905 | B2 * | 5/2009 | Ishino et al. ................... 257/777 |
| 7,539,376 | B2 | 5/2009 | Bozso et al. ..................... 385/33 |
| 7,561,410 | B1 | 7/2009 | Lee et al. ....................... 361/525 |

(Continued)

FOREIGN PATENT DOCUMENTS

JP   2007-157266 A   6/2007
JP   2008-251964 A   10/2008

*Primary Examiner* — Chris Chu
(74) *Attorney, Agent, or Firm* — McGinn IP Law Group, PLLC

(57) ABSTRACT

A method of forming a semiconductor device includes forming first and second bumps on a semiconductor substrate, forming first and second penetration electrodes penetrating the semiconductor substrate, forming a first conductive structure making a first electrical path between the first bump and the first penetration electrode, and forming a second conductive structure making a second electrical path between the second bump and the second penetration electrode, the second conductive structure being smaller in resistance value than the first conductive structure.

16 Claims, 22 Drawing Sheets

(56) References Cited

U.S. PATENT DOCUMENTS

| | | |
|---|---|---|
| 7,675,181 B2 | 3/2010 | Lee .................................. 257/777 |
| 7,757,196 B2 | 7/2010 | Bird et al. ........................ 716/12 |
| 7,781,880 B2 | 8/2010 | Egawa ............................ 257/686 |
| 7,868,462 B2 | 1/2011 | Choi et al. ...................... 257/777 |
| 7,872,841 B2 | 1/2011 | Leduc et al. .................... 361/56 |
| 7,906,846 B2 | 3/2011 | Hoshino et al. ................ 257/724 |
| 7,923,370 B2 | 4/2011 | Pyeon ............................. 438/667 |
| 7,937,830 B2 * | 5/2011 | Shioga et al. ................... 29/832 |
| 7,985,930 B2 | 7/2011 | Asai et al. ...................... 174/264 |
| 7,994,623 B2 | 8/2011 | Nonomura et al. ............ 257/686 |
| 8,116,100 B2 | 2/2012 | Saen et al. ...................... 361/803 |
| 8,159,057 B2 | 4/2012 | Okada et al. ................... 257/684 |
| 8,164,920 B2 * | 4/2012 | Kariya ............................ 361/794 |
| 8,174,115 B2 | 5/2012 | Chung ............................ 257/723 |
| 8,174,124 B2 * | 5/2012 | Chiu et al. ...................... 257/773 |
| 8,178,953 B2 | 5/2012 | Barth et al. .................... 257/659 |
| 8,193,039 B2 | 6/2012 | Su et al. ......................... 438/113 |
| 8,338,939 B2 * | 12/2012 | Lin et al. ........................ 257/693 |
| 8,344,512 B2 * | 1/2013 | Knickerbocker .............. 257/773 |
| 8,344,514 B2 | 1/2013 | Cobbley et al. ............... 257/773 |
| 8,362,593 B2 | 1/2013 | Yang et al. ..................... 257/619 |
| 8,378,495 B2 * | 2/2013 | West ............................... 257/774 |
| 8,381,157 B2 | 2/2013 | Nishioka et al. ............... 716/110 |
| 8,476,163 B2 * | 7/2013 | Li et al. .......................... 438/667 |
| 8,476,771 B2 * | 7/2013 | Scheuermann et al. ...... 257/774 |
| 2006/0223301 A1 | 10/2006 | Vanhaelemeersch et al. 438/618 |
| 2007/0126105 A1 | 6/2007 | Yamada et al. ................ 257/686 |
| 2008/0142976 A1 | 6/2008 | Kawano ......................... 257/758 |
| 2008/0237781 A1 | 10/2008 | Uchiyama ..................... 257/508 |
| 2009/0139760 A1 | 6/2009 | Tanaka ........................... 174/264 |
| 2010/0171226 A1 * | 7/2010 | West et al. ..................... 257/774 |
| 2010/0252934 A1 | 10/2010 | Law et al. ...................... 257/774 |
| 2011/0180936 A1 | 7/2011 | Cobbley et al. ................ 257/774 |
| 2011/0186990 A1 | 8/2011 | Mawatari et al. ............. 257/737 |

\* cited by examiner

SEMICONDUCTOR DEVICE AND INFORMATION PROCESSING SYSTEM INCLUDING THE SAME

REFERENCE TO RELATED APPLICATION

This application is a Continuation Application of U.S. patent application Ser. No. 13/720,265, which was filed on Dec. 19, 2012, and which is a Continuation Application of U.S. patent application Ser. No. 12/923,789 which was filed on Oct. 7, 2010, now U.S. Pat. No. 8,350,389, which, in turn, claims priority to Japanese Patent Application 2009-235491, filed on Oct. 9, 2009.

BACKGROUND OF THE INVENTION

1. Field of the Invention

The present invention relates to a semiconductor device and an information processing system including the same. More particularly, the present invention relates to a semiconductor device that includes a stacked structure of plural core chips and an information processing system including the same.

2. Description of the Related Art

A memory capacity that is required in a semiconductor device such as a dynamic random access memory (DRAM) has increased every year. In recent years, a memory device that is called a multi-chip package where plural memory chips are laminated is suggested to satisfy the required memory capacity. However, since the memory chip used in the multi-chip package is a common memory chip capable of operating even though the memory chip is a single chip, a so-called front end unit that performs a function of an interface with an external device (for example, memory controller) is included in each memory chip. For this reason, an area for a memory core in each memory chip is restricted to an area obtained by subtracting the area for the front end unit from a total chip area, and it is difficult to greatly increase a memory capacity for each chip (for each memory chip).

In addition, a circuit that constitutes the front end unit is manufactured at the same time as a back end unit including a memory core, regardless of the circuit being a circuit of a logic system. Therefore there has been a further problem that it is difficult to speed up the front end unit.

As a method to resolve the above problem, a method that integrates the front end unit and the back end unit in individual chips and laminates these chips, thereby constituting one semiconductor device, is suggested (for example, Japanese Patent Application Laid-Open (JP-A) No. 2007-157266). According to this method, with respect to plural core chips each of which is integrated with the back end unit without the front end unit, it becomes possible to increase a memory capacity for each chip (for each core chip) because an occupied area assignable for the memory core increases. Meanwhile, with respect to an interface chip that is integrated with the front end unit and is common to the plural core chips, it becomes possible to form its circuit with a high-speed transistor because the interface chip can be manufactured using a process different from that of the memory core. In addition, since the plural core chips can be allocated to one interface chip, it becomes possible to provide a semiconductor device that has a large memory capacity and a high operation speed as a whole.

JP-A No. 2007-157266 discloses a structure having core chips (DRAM chips) stacked in five layers, having an interface chip stacked thereon, and having these chips connected together through a through silicon via (hereinafter, "TSV").

JP-A No. 2008-251964 discloses a structure of a TSV in a chip-stack semiconductor device in detail. The semiconductor device described in JP-A No. 2008-251964 includes a TSV that penetrates a semiconductor substrate and a ring-shaped isolation trench provided by penetrating a silicon substrate to surround the TSV. One end of the TSV is connected to a wiring through a connection electrode. The connection electrode is formed by having an electrode material embedded into an opening that penetrates an interlayer dielectric film of an element forming layer, and the wiring is connected to the TSV through this connection electrode.

According to JP-A No. 2008-251964, the TSV penetrates a semiconductor substrate. A parasitic capacitance is generated between the semiconductor substrate (a ground potential) and the TSV (a signal or a power source). The parasitic capacitance needs to be as small as possible because it causes a negative influence on the TSV of a signal system such as degrading its signal quality. However, when a parasitic capacitance of a TSV of a power source system and the parasitic capacitance of the TSV of the signal system are decreased, stability of a power source potential is degraded.

The connection electrode connected to the one end of the TSV is formed by having an electrode material embedded into a large opening formed on the interlayer dielectric film of the element forming layer. However, it is very difficult to achieve both a process of forming a very small through-hole to form an element and a process of forming a very large opening for the connection electrode in the same process. Therefore, it is necessary to perform separate processes.

SUMMARY

In one embodiment, there is provided a semiconductor device comprising a plurality of through silicon vias that penetrate a semiconductor substrate, and a plurality of wiring pads respectively connected to the through silicon vias, wherein among the wiring pads, a size of a wiring pad to which a power source potential is supplied is larger than a size of a wiring pad to which a signal is supplied.

There is provided a semiconductor device according to the present invention, comprising: a first chip including a plurality of first through silicon vias that penetrate a first semiconductor substrate, and a plurality of first wiring pads respectively connected to the first through silicon vias, where among the first wiring pads, a size of the first wiring pad to which a power source potential is supplied is larger than a size of the first wiring pad to which a first control signal is supplied; and a second chip including a plurality of second through silicon vias that penetrate a second semiconductor substrate, and a plurality of second wiring pads respectively connected to the second through silicon vias, where among the second wiring pads, a size of the second wiring pad to which the power source potential is supplied is larger than a size of the second wiring pad to which a second control signal is supplied, wherein the first chip and the second chip are stacked together.

According to the present invention, it is preferred that the semiconductor device, wherein the first chip further includes a first back surface bump connected to one end side of the first through silicon vias, and a first surface bump provided above the first wiring pads and connected to the other end side of the second through silicon vias, the second chip further includes a second back surface bump connected to one end side of the second through silicon vias, and a second surface bump provided above the second wiring pads and connected to the other end side of the second through silicon vias, and the first back surface bump and the second surface bump are connected together.

There is provided a semiconductor device according to the present invention, comprising: a semiconductor substrate; a first through silicon via and a second through silicon via that penetrate the semiconductor substrate; a plurality of first pads connected to the first through silicon via; and a plurality of second pads connected to the second through silicon via, wherein a size of the second pad nearest to the semiconductor substrate is larger than a size of the first pad nearest to the semiconductor substrate.

There is provided a semiconductor device according to the present invention comprising a plurality of first chips and a second chip that controls the first chips, wherein at least each of the first chips includes: a semiconductor substrate; a first through silicon via and a second through silicon via that penetrate the semiconductor substrate; a plurality of wiring layers provided at an upper side of the semiconductor substrate; a plurality of first pads provided in each of the wiring layers and connected to the first through silicon via; and a plurality of second pads provided in each of the wiring layers and connected to the second through silicon via, wherein among the wiring layers, a size of the second pad provided in a first wiring layer nearest to the semiconductor substrate is larger than a size of the first pad provided in the first wiring layer.

In addition, there is provided an information processing system comprising: a semiconductor device including a plurality of core chips each of which has a corresponding memory cell array, and an interface chip that controls the core chips; and a controller that controls the semiconductor device, wherein at least each of the core chips includes: a semiconductor substrate; a first through silicon via and a second through silicon via that penetrate the semiconductor substrate; a plurality of wiring layers provided at an upper side of the semiconductor substrate; a plurality of first pads provided in each of the wiring layers and connected to the first through silicon via; and a plurality of second pads provided in each of the wiring layers and connected to the second through silicon via, wherein among the wiring layers, a size of the second pad provided in a first wiring layer nearest to the semiconductor substrate is larger than a size of the first pad provided in the first wiring layer.

According to the present invention, because a size of the pad connected to the second through silicon via as the power source system is relatively large, a larger capacitance component can be obtained for the through silicon via of the power source system than a capacitance component of the through silicon via of the signal system. Consequently, the power source potential can be stabilized. Because the size of the pad of the power source system is large, the number of through-hole electrode provided between pads can be larger than that of the signal system, and the parasitic resistance of the through silicon via of the power source system can be decreased. On the other hand, because a size of the pad connected to the first through silicon via as the signal system is relatively small, a capacitance component of the through silicon via of the signal system can be set smaller than the capacitance component of the through silicon via of the power source system. Accordingly, it is possible to prevent degradation of signal quality due to an increase in a parasitic capacitance.

BRIEF DESCRIPTION OF THE DRAWINGS

The above features and advantages of the present invention will be more apparent from the following description of certain preferred embodiments taken in conjunction with the accompanying drawings, in which:

FIG. 5A shows a signal system and FIG. 5B shows a power source system;

DETAILED DESCRIPTION OF PREFERRED EMBODIMENTS

Preferred embodiments of the present invention will be explained below in detail with reference to the accompanying drawings.

Figure 1:
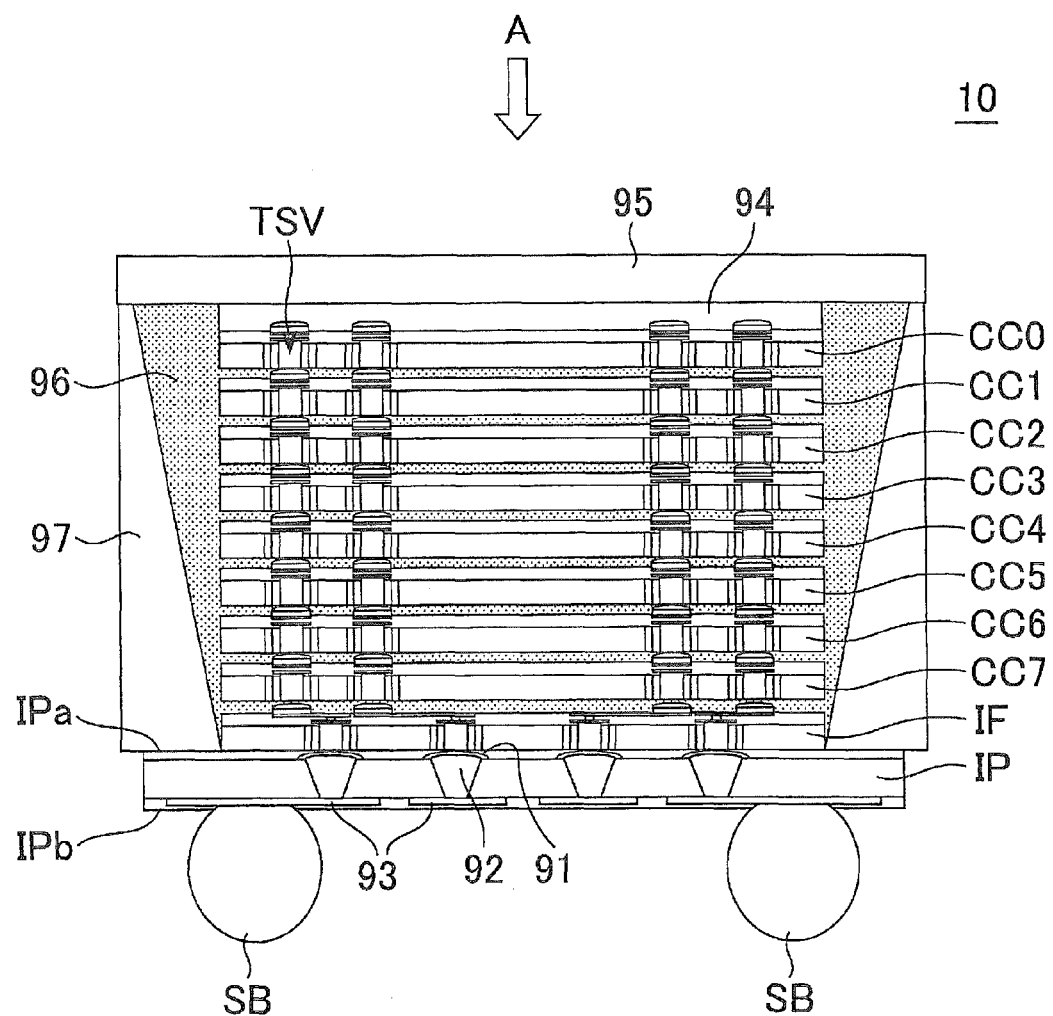
FIG. 1 is a schematic cross-sectional view illustrating the structure of a semiconductor device according to the preferred embodiment of the present invention.

FIG. 1 is a schematic cross-sectional view provided for explaining the structure of a semiconductor device 10 according to the preferred embodiment of the present invention.

As shown in FIG. 1, the semiconductor device 10 according to this embodiment has the structure where 8 core chips CC0 to CC7 that have the same function and structure and are manufactured using the same manufacture mask, an interface chip IF that is manufactured using a manufacture mask different from that of the core chips and an interposer IP are laminated. The core chips CC0 to CC7 and the interface chip IF are semiconductor chips using a silicon substrate and are electrically connected to adjacent chips in a vertical direction through plural Through Silicon Vias (TSV) penetrating the silicon substrate. The through silicon via TSV is a kind of penetration electrode penetrating a substrate. Meanwhile, the interposer IP is a circuit board that is made of a resin, and plural external terminals (solder balls) SB are formed in a back surface IPb of the interposer IP.

Each of the core chips CC0 to CC7 is a semiconductor chip which consists of circuit blocks other than a so-called front end unit (front end function) performing a function of an interface with an external device through an external terminal among circuit blocks included in a 1 Gb DDR3 (Double Data Rate 3)-type SDRAM (Synchronous Dynamic Random Access Memory). The SDRAM is a well-known and common memory chip that includes the front end unit and a so-called back end unit having a plural memory cells and accessing to the memory cells. The SDRAM operates even as a single chip and is capable to communicate directly with a memory controller. That is, each of the core chips CC0 to CC7 is a semiconductor chip where only the circuit blocks belonging to the back end unit are integrated in principle. As the circuit blocks that are included in the front end unit, a parallel-serial converting circuit (data latch circuit) that performs parallel/serial conversion on input/output data between a memory cell array and a data input/output terminal and a DLL (Delay Locked Loop) circuit that controls input/output timing of data are exemplified, which will be described in detail below. The interface chip IF is a semiconductor chip in which only the front end unit is integrated. Accordingly, an operation frequency of the interface chip is higher than an operation frequency of the core chip. Since the circuits that belong to the front end unit are not included in the core chips CC0 to CC7, the core chips CC0 to CC7 cannot be operated as the single chips, except for when the core chips are operated in a wafer state for a test operation in the course of manufacturing the core chips. The interface chip IF is needed to operate the core chips CC0 to CC7. Accordingly, the memory integration of the core chips is denser than the memory integration of a general single chip. In the semiconductor device 10 according to this embodiment, the interface chip has a front end function for communicating with the external device at a first operation frequency, and the plural core chips have a back end function for communicating with only the interface chip at a second operation frequency lower than the first operation frequency. Accordingly, each of the plural core chips includes a memory cell array that stores plural information, and a bit number of plural read data for each I/O (DQ) that are supplied from the plural core chips to the interface chip in parallel is plural and associated with a one-time read command provided from the interface chip to the core chips. In this case, the plural bit number corresponds to a prefetch data number to be well-known.

The interface chip IF functions as a common front end unit for the eight core chips CC0 to CC7. Accordingly, all external accesses are performed through the interface chip IF and inputs/outputs of data are also performed through the interface chip IF. In this embodiment, the interface chip IF is disposed between the interposer IP and the core chips CC0 to CC7. However, the position of the interface chip IF is not restricted in particular, and the interface chip IF may be disposed on the core chips CC0 to CC7 and may be disposed on the back surface IPb of the interposer IP. When the interface chip IF is disposed on the core chips CC0 to CC7 in a face-down manner or is disposed on the back surface IPb of the interposer IP in a face-up manner, the TSV does not need to be provided in the interface chip IF. The interface chip IF may be disposed to be interposed between the two interposers IP.

The interposer IP functions as a rewiring substrate to increase an electrode pitch and secures mechanical strength of the semiconductor device 10. That is, an electrode 91 that is formed on a top surface IPa of the interposer IP is drawn to the back surface IPb via a through-hole electrode 92 and the pitch of the external terminals SB is enlarged by the rewiring layer 93 provided on the back surface IPb. In FIG. 1, only the two external terminals SB are shown. In actuality, however, three or more external terminals are provided. The layout of the external terminals SB is the same as that of the DDR3-type SDRAM that is determined by the regulation. Accordingly, the semiconductor device can be treated as one DDR3-type SDRAM from the external controller.

As shown in FIG. 1, a top surface of the uppermost core chip CC0 is covered by an NCF (Non-Conductive Film) 94 and a lead frame 95. Gaps between the core chips CC0 to CC7 and the interface chip IF are filled with an underfill 96 and surrounding portions of the gaps are covered by a sealing resin 97. Thereby, the individual chips are physically protected.

Figures 2A, 2B, 2C:
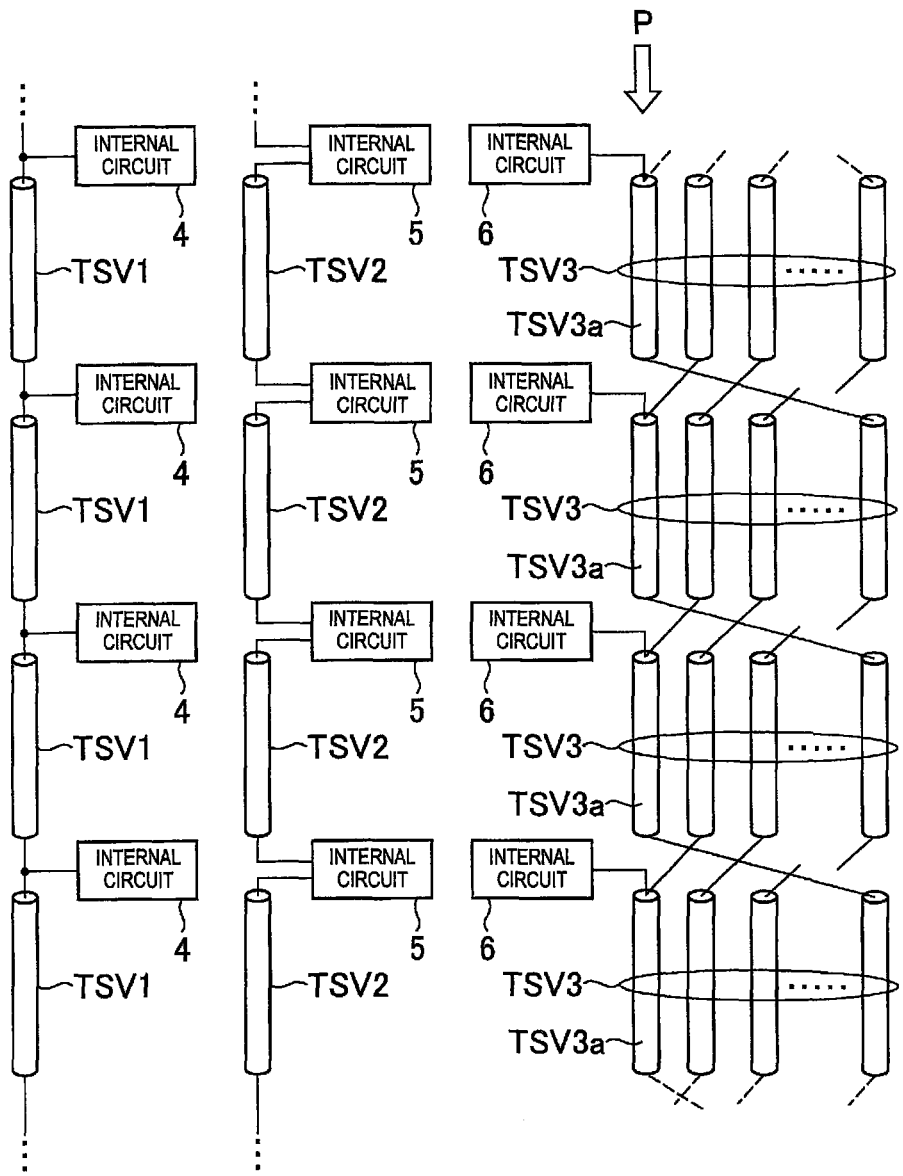
FIGS. 2A to 2C are diagrams showing the various types of TSV1 provided in a core chip.

When most of the TSVs provided in the core chips CC0 to CC7 are two-dimensionally viewed from a lamination direction, that is, viewed from an arrow A shown in FIG. 1, the TSVs are short-circuited from the TSVs of other layers provided at the same position. That is, as shown in FIG. 2A, the vertically disposed TSV1s that are provided at the same position in plain view are short-circuited, and one wiring line is configured by the TSV1. The TSV1 that are provided in the core chips CC0 to CC7 are connected to internal circuits 4 in the core chips, respectively. Accordingly, input signals (command signal, address signal, etc.) that are supplied from the interface chip IF to the TSV1s shown in FIG. 2A are commonly input to the internal circuits 4 of the core chips CC0 to CC7. Output signals (data etc.) that are supplied from the core chips CC0 to CC7 to the TSV1 are wired-ORed and input to the interface chip IF.

Meanwhile, as shown in FIG. 2B, the a part of TSVs are not directly connected to the TSV2 of other layers provided at the same position in plain view but are connected to the TSV2 of other layers through the internal circuits 5 provided in the core chips CC0 to CC7. That is, the internal circuits that are provided in the core chips CC0 to CC7 are cascade-connected through the TSV2. This kind of TSV2 is used to sequentially transmit predetermined information to the internal circuits 5 provided in the core chips CC0 to CC7. As this information, layer address information to be described below is exemplified.

Another TSV group is short-circuited from the TSVs of other layer provided at the different position in plan view, as shown in FIG. 2C. With respect to this kind of TSV group 3, internal circuits 6 of the core chips CC0 to CC7 are connected to the TSV3a provided at the predetermined position P in plain view. Thereby, information can be selectively input to the internal circuits 6 provided in the core chips. As this information, defective chip information to be described below is exemplified.

As such, as types of the TSVs provided in the core chips CC0 to CC7, three types (TSV1 to TSV3) shown in FIGS. 2A to 2C exist. As described above, most of the TSVs are of a type shown in FIG. 2A, and an address signal, a command signal, and a clock signal are supplied from the interface chip IF to the core chips CC0 to CC7, through the TSV1 of the type shown in FIG. 2A. Read data and write data are input to and output from the interface chip IF through the TSV1 of the type shown in FIG. 2A. Meanwhile, the TSV2 and TSV3 of the types shown in FIGS. 2B and 2C are used to provide individual information to the core chips CC0 to CC7 having the same structure.

Figure 3:
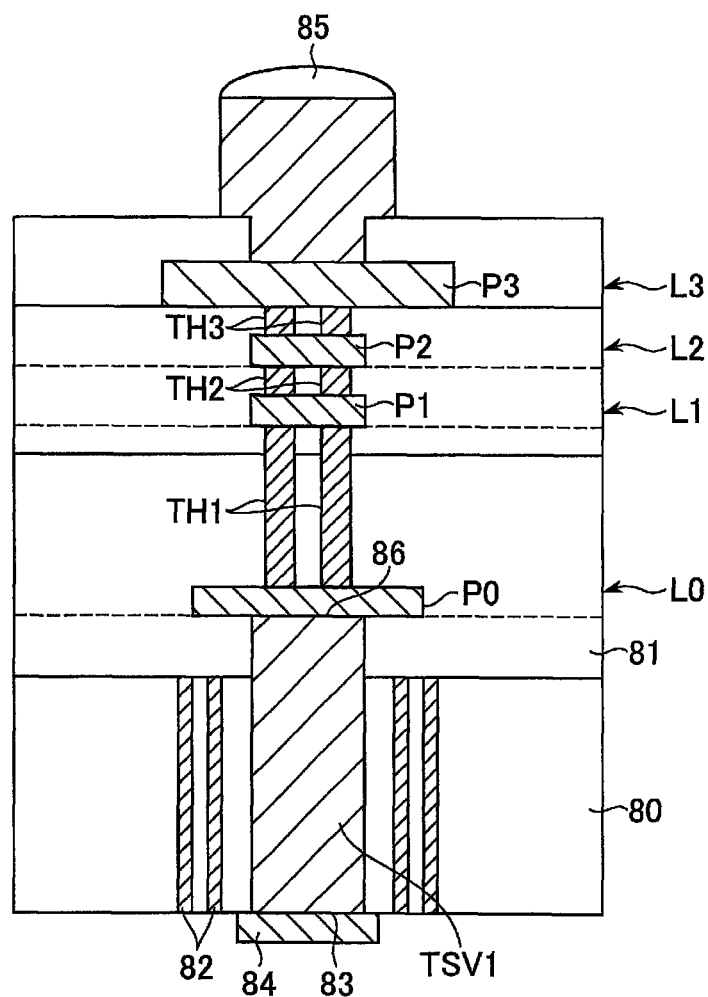
FIG. 3 is a cross-sectional view illustrating the structure of the TSV of the type shown in FIG. 2A.

FIG. 3 is a cross-sectional view illustrating the structure of the TSV1 of the type shown in FIG. 2A.

As shown in FIG. 3, the TSV1 is provided to penetrate a silicon substrate 80 and an interlayer insulating film 81 provided on an upper surface of the silicon substrate 80. Around the TSV1, an insulating ring 82 is provided. Thereby, the TSV1 and a transistor region are insulated from each other.

An end 83 of the TSV1 at the back surface of the silicon substrate 80 is covered by a back surface bump 84. The back surface bump 84 is an electrode that contacts an upper surface bump 85 provided in a core chip of a lower layer. The upper surface bump 85 is connected to an end 86 of the TSV1, through plural pads P0 to P3 provided in wiring layers L0 to L3 and plural through-hole electrodes TH1 to TH3 connecting the pads to each other. Thereby, the upper surface bump 85 and the back surface bump 84 that are provided at the same position in plain view are short-circuited. Connection with internal circuits (not shown in the drawings) is performed through internal wiring lines (not shown in the drawings) drawn from the pads P0 to P3 provided in the wiring layers L0 to L3.

The structure of the TSV shown in FIG. 3 is explained in more detail. The semiconductor device 10 according to the present embodiment has different sizes in pads of a signal system TSV and a power-source system TSV.

Figure 4:
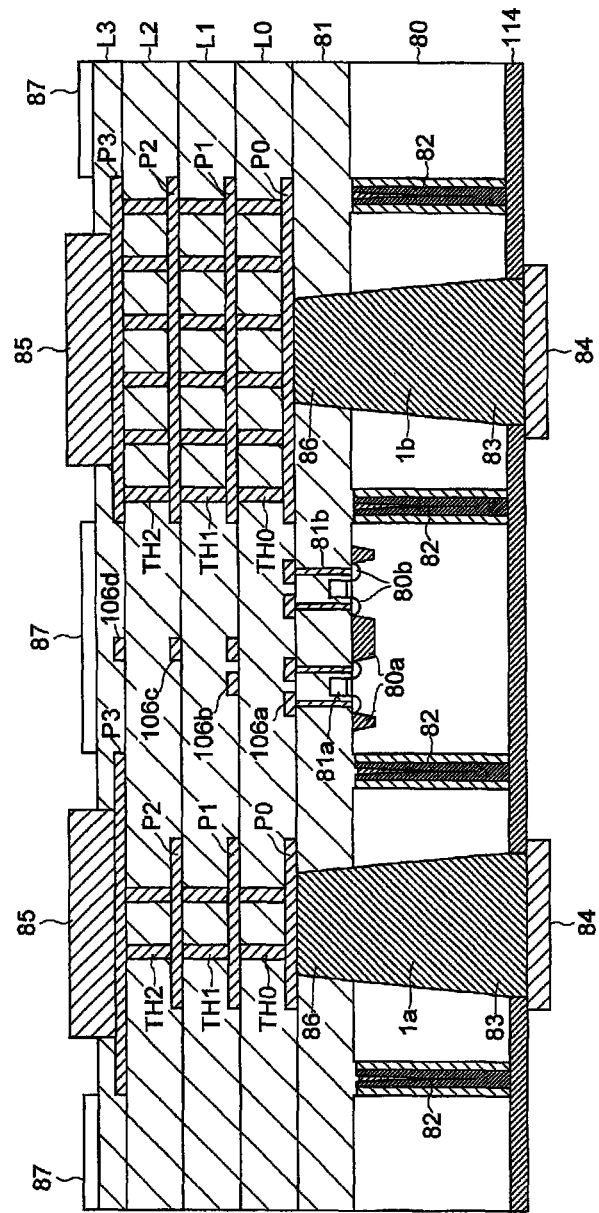
FIG. 4 is a cross-sectional view illustrating the structure of the TSV of the semiconductor device 10.

FIG. 4 is a schematic cross-sectional view for explaining the structure of the TSV in detail.

As shown in FIG. 4, the semiconductor device 10 includes a signal system TSV1a and a power-source system TSV1b that penetrate the silicon substrate 80. Hereinafter, TSV1 indicates both TSV1a and TSV1b. The TSV1 is provided to penetrate the interlayer dielectric film 81 formed on the silicon substrate 80 and an upper surface thereof. The insulation ring 82 is provided around the TSV1, thereby securing insulation of the TSV1 from a transistor region.

An STI (Shallow Trench Isolation) 80a and a diffusion layer 80b are formed near the upper surface of the silicon substrate 80. A gate electrode 81a and a through-hole electrode 81b are formed on an element isolation layer in which the interlayer dielectric film 81 is formed, thereby forming a transistor element on the silicon substrate 80.

One end 83 of the TSV1 exposed to a back surface of the silicon substrate 80 is covered by the back surface bump 84. The back surface bump 84 is in contact with the upper surface bump 85 provided on a lower-layer core chip. The other end 86 of the TSV1 is connected to the upper surface bump 85 provided on the upper surface, through the pads P0 to P3 provided in the wiring layers L0 to L3 and through the through-holes TH1 to TH3 that connect between upper and lower pads. Therefore, the upper surface bump 85 and the back surface bump 84 provided at the same position in a planar view are short-circuited through the TSV1, the pads P0 to P3, and the through-hole electrodes TH1 to TH3.

The total number of the pads P0 to P3 is the same as the number of wiring layers arranged in core chips or in an interface chip. For example, the core chips CC0 to CC7 according to the present embodiment have the tungsten wiring layer L0, the first aluminum wiring layer L1, the second aluminum wiring layer L2, and the third aluminum wiring layer L3. The pads P0 to P3 are respectively provided in these layers. The wiring layers are not limited to four layers, and can be any number of layers. In addition, the wirings are not limited to a tungsten wiring or an aluminum wiring. Other metal wirings such as a copper wiring can be used and a silicon material such as DOPOS (Doped Poly-silicon) can be used.

Figure 5A:
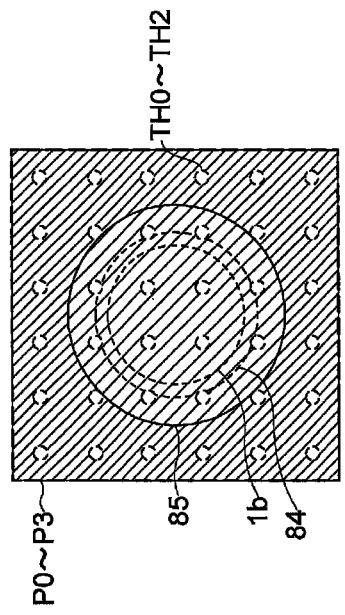
FIGS. 5A and 5B are schematic plan views showing shapes of a TSV and a pad of a signal system and a power source system, where
Figure 5B:
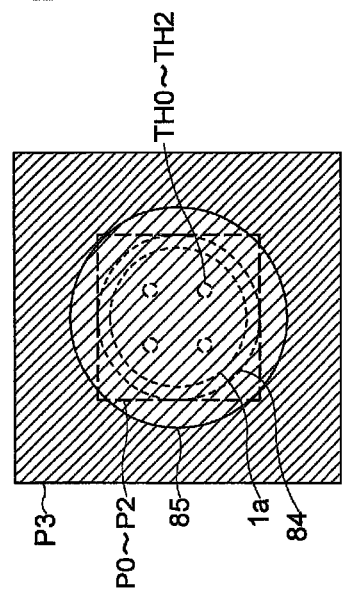

FIGS. 5A and 5B are schematic plan views showing shapes of a TSV and a pad of a signal system and a power source system, where FIG. 5A shows a signal system and FIG. 5B shows a power source system.

As shown in FIGS. 5A and 5B, in the present embodiment, sizes (surface areas) of the pads P0 to P2 connected to the power-source system TSV1b are set larger than those of the pads P0 to P2 connected to the signal system. TSV1a. Although planar shapes of the pads P0 to P3 of the signal system and the power source system are squares, these shapes are not limited to squares, and can be rectangles or circles. Furthermore, although the planar shapes of the pads P0 to P3 are squares, it can be also arranged such that the planar shapes of the pads P0 to P3 of the signal system are circles and the planar shapes of the pads P0 to P3 of the power source system are squares.

A parasitic capacitance is generated between the pads P0 to P3 and the silicon substrate 80. A parasitic capacitance of the pads becomes a cause of degradation in the quality of a high-frequency signal flowing through the signal system TSV1a. The parasitic capacitance becomes larger when the size of a pad becomes larger, and therefore the sizes of the pads P0 to P3 of the signal system are preferably as small as possible. However, the power-source system TSV1b does not have such problems, and preferably has a larger capacitance from a viewpoint of stability of a power source potential.

Among the pads P0 to P3 connected to the TSV1a and TSV1b, the pad P0 in the wiring layer L0 has a largest influence on the parasitic capacitance between the pad P0 and the silicon substrate 80. Because the pad P0 is directly connected to the end 86 of the TSV1 and is nearest to the silicon substrate 80, this parasitic capacitance is larger than that in other pads P1 to P3. Although a parasitic capacitance is also generated between the other pads P1 to P3 and the silicon substrate 80, these pads do not have such a large influence as that of the pad P0. Therefore, at least the pad P0 of the power source system needs to be set larger than the pad P0 of the signal system. When the pads P1 to P3 of the power source system are set larger than the pads P1 to P3 of the signal system, the parasitic resistance becomes larger, and this is more preferable.

Considering a matching margin to the back surface bump 84, the upper surface bump 85 is preferably slightly larger than the back surface bump 84. To set the upper surface bump 85 larger than the back surface bump 84, preferably, the pad P3 in a fourth layer as a ground surface of the upper surface bump 85 is made larger than the upper surface bump 85. A parasitic capacitance of the pad P3 increases when the pad P3 is set larger. However, because the pad P3 is sufficiently separated from the silicon substrate 80, the parasitic capacitance of the pad P3 is sufficiently smaller than the pad P3 in a first layer. Therefore, there is no particular problem when a size of the pad P3 is set larger than those of the pads P0 to P2 in the signal system TSV1a.

For the above reasons, in the present embodiment, only the sizes of the pads P0 to P2 in the first to third layers are set relatively small among the pads P0 to P3 connected to the signal system TSV1a. As the signal system TSV1a is compared with the power-source system TSV1b, sizes of the pads P0 to P2 in the first to third layers in the power source system are larger than those in the signal system. The size of the pad P3 in the fourth layer in the power source system is equal to or slightly larger than that in the signal system.

As explained above, in the present embodiment, the sizes of the pads P0 to P2 provided in the wiring layers L0 to L3 in the first to third layers are made different between those in the signal system and those in the power source system. Considering an influence of a parasitic capacitance caused by each pad, it is sufficient that at least a size of the pad P0 in the first layer in the signal system is made different from that in the power source system. With this configuration, it is possible to prevent degradation of signal quality of the signal system TSV1a, and possible to stabilize the power source potential supplied to the power-source system TSV1b.

The through-hole electrodes TH1 to TH3 are provided between the pads P0 and P3. The through-hole electrodes TH1 to TH3 are provided at a constant pitch between the pads. Because the sizes of the pads P0 to P2 in the power source system are larger than those in the signal system, more through-hole electrodes can be provided between pads in the power source system. Therefore, it is possible to set the parasitic capacitance of the power-source system TSV smaller than that of the signal system, and possible to reduce consumption power.

Sizes of the pads P0 to P3, the supper surface bump 85 and the back surface bump 84 or the like can be set to match the size of the TSV. For example, in the signal system, when the TSV is a circle having a maximum diameter of 20 μm, the back surface bump 84 is set as a circle having a diameter of about 22 μm, and the pad P0 in the first layer is set as a square of about 22 μm in one side, considering a matching margin with the TSV. The pads P1 and P2 in the second and third layers are also set in the same sizes as that of the pad P0 in the first layer, and the pad P3 in the fourth layer is set as a square of about 37 μm in one side. An opening of a square of about 22 μm in one side is formed on the cover layer 87 (a SiON film) in the top layer, and the upper surface bump 85 is set as a circle having a diameter of about 28 μm.

In the power source system, when a shape and a size of the TSV are the same as those in the signal system, the back surface bump 84 is set as a circle having a diameter of about 22 μm, and the pad P0 in the first layer is set as a square of about 37 μm in one side. The pads P1 to P3 in the second to fourth layers are also set in the same sizes as that of the pad P0 in the first layer. An opening of a square of about 22 μm in one side is formed on the cover layer 87 (a SiON film) in the top layer, and the upper surface bump 85 is set as a circle having a diameter of about 28 μm.

Figure 6:
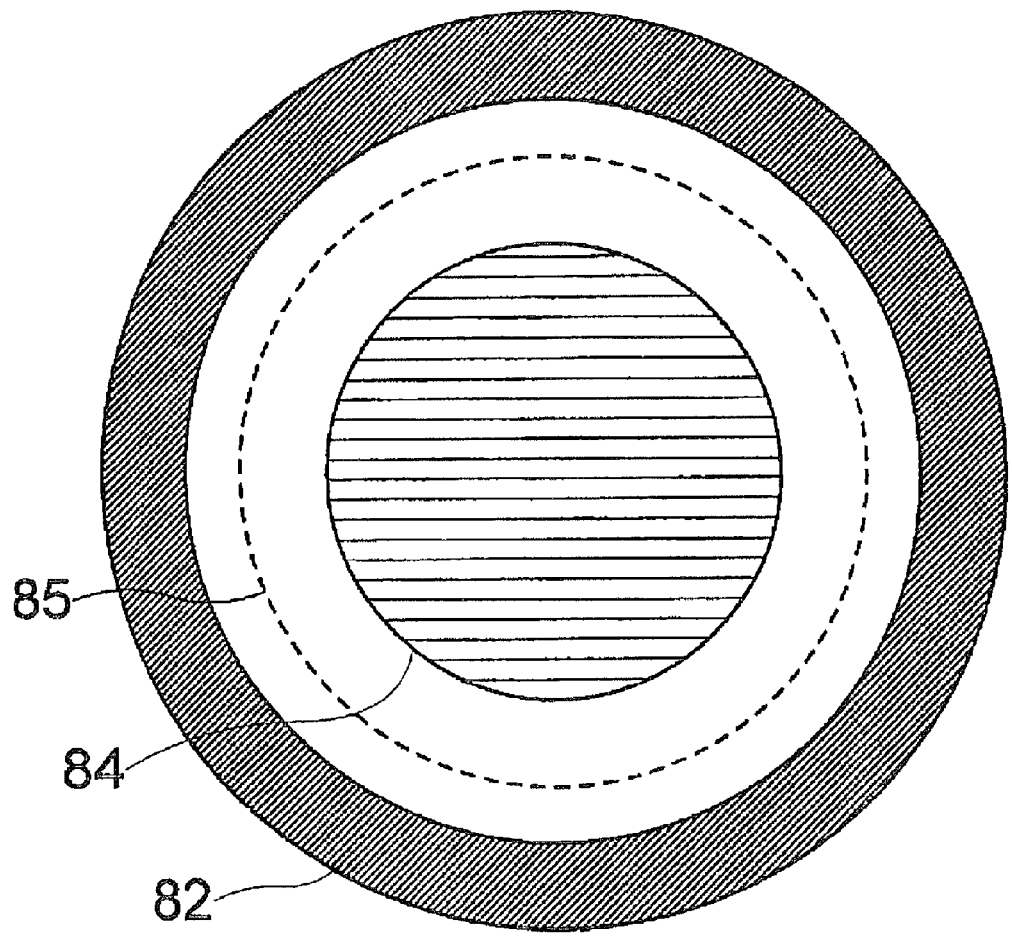
FIG. 6 is a plan view of the upper surface bump 85, the back surface bump 84, and the insulation ring 82 showing their positional relationship.

FIG. 6 is a plan view of the upper surface bump 85, the back surface bump 84, and the insulation ring 82 showing their positional relationship.

As shown in FIG. 6, it is preferable that the upper surface bump 85 is provided at the inside of the insulation ring surrounding the TSV, and the back surface bump 84 is provided at the inside of the upper surface bump 85. Preferably, both planar shapes of the upper surface bump 85 and the back surface bump 84 are circles to secure a contact area between the upper surface bump 85 and the back surface bump 84 as large as possible even when there is a misalignment between the upper surface bump 85 and the back surface bump 84. The above shapes of the upper surface bump 85 and the back surface bump 84 are preferably similarly applied to the insulation ring 82. When the insulation ring 82 is a circle and the upper surface bump 85 is a rectangle, for example, there is a possibility that corners of the rectangle stretch out from the insulation ring 82 due to a misalignment, and the parasitic capacitance of the TSV at stretch-out parts becomes large.

Figure 7:
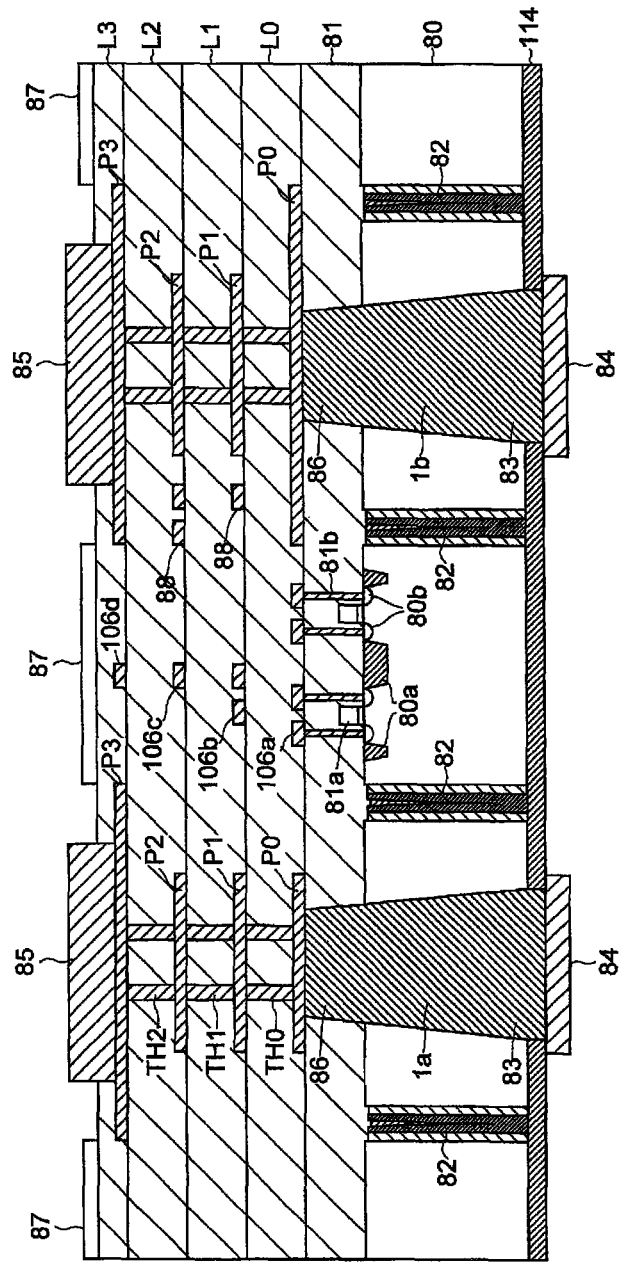
FIG. 7 is a cross-sectional view of a modification of the pads P0 to P2 connected to the power-source system TSV1*b*.

FIG. 7 is a cross-sectional view showing a modification of the pads P0 to P2 connected to the power-source system TSV1b.

As shown in FIG. 7, in the power-source system TSV1b according to the present embodiment, only the pads P0 and P3 of the wiring layers L0 and L3 are relatively large, and the pads P1 and P2 of the wiring layers L1 and L2 at an intermediate position are smaller than the pads P1 and P3. The signal wiring 88 is formed in a space generated by small sizes of the pads P1 and P2. Therefore, the signal wiring 88 has a part overlapped with the pads P0 and P3 in a planar view.

As described above, among the pads P0 to P3 connected to the TSV1b, the pad P0 nearest to the silicon substrate 80 has a largest parasitic capacitance between the silicon substrate 80 and this pad. A parasitic capacitance is also generated between other pads P1 to P3 and the silicon substrate 80, and this becomes a cause of increasing a parasitic capacitance of the TSV, but there is not so large influence as that of the pad P0. Therefore, when the pad P1 has a large size, a relatively large parasitic capacitance can be secured even when sizes of the pads P2 and P3 in higher layers are slightly smaller.

From the above viewpoint, in the present embodiment, the areas of the pads P1 and P2 in the intermediate wiring layers L1 and L2 are set small, and a space generated by this is used for other wirings. Therefore, according to the present embodiment, an efficient wiring layout can be achieved while sufficiently securing a capacitance component of the power-source system TSV1b.

FIGS. 8 to 21 are schematic process diagrams showing a manufacturing process of the semiconductor device 10 according to the preferred embodiment of the present invention.

Figure 8:
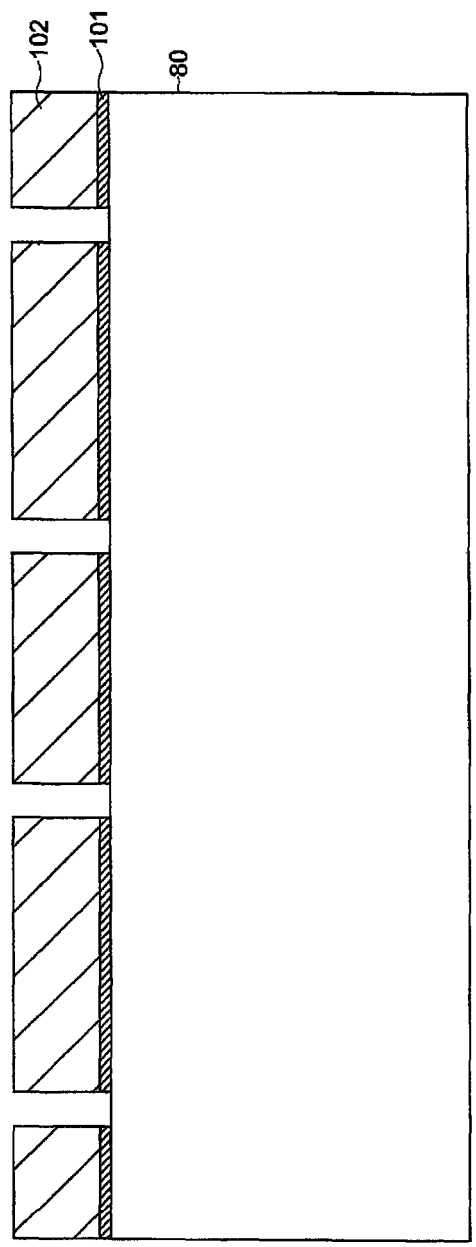
FIG. 8 is a partial cross-sectional view showing a schematic process diagram of a manufacturing process of the semiconductor device (formation of the silicon nitride film 101 and the mask layer 102) according to preferred embodiments of the present invention.

When the semiconductor device 10 is manufactured, as shown in FIG. 8, a silicon nitride film 101 is first formed as an oxidation-resistant protection film in a subsequent thermal oxidation process. A mask layer 102 is then formed by photoresist on the silicon nitride film 101. The mask layer 102 has openings to form ring-shaped isolation trenches.

Figure 9:
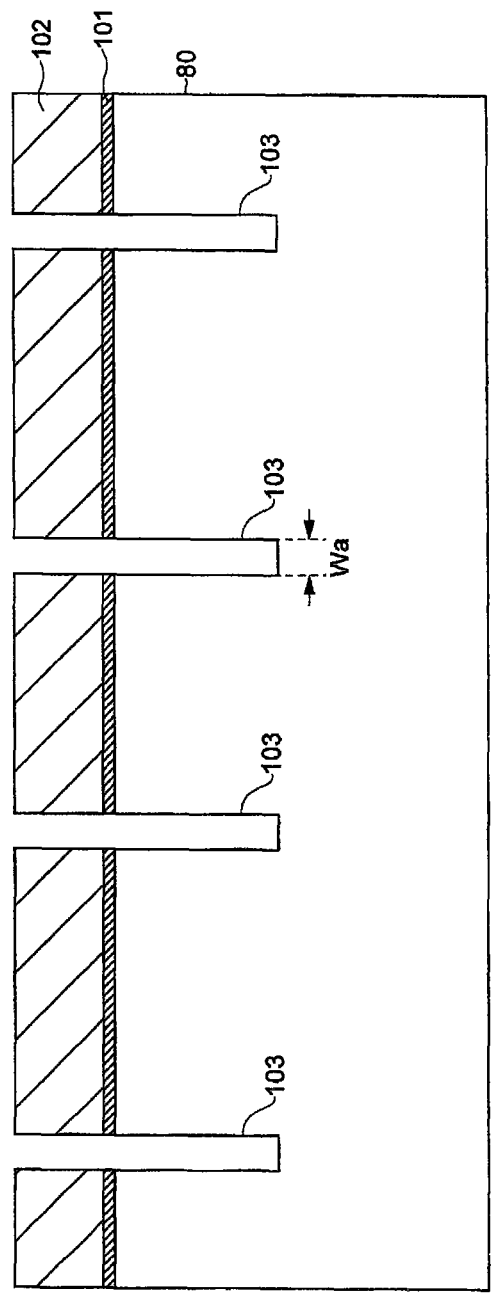
FIG. 9 is a partial cross-sectional view showing a schematic process diagram of a manufacturing process of the semiconductor device (formation of isolation trenches 103) according to preferred embodiments of the present invention.

As shown in FIG. 9, the silicon nitride film 101 and the silicon substrate 80 are etched by using the mask layer 102, thereby forming ring-shaped isolation trenches 103 each having a width Wa of about 5,000 nm.

Figure 10:
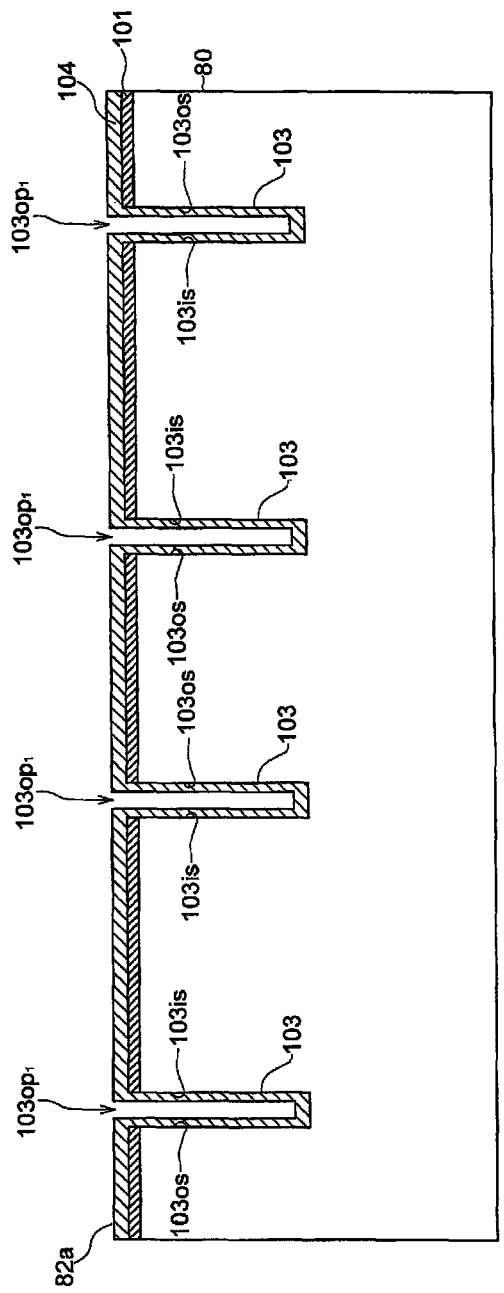
FIG. 10 is a partial cross-sectional view showing a schematic process diagram of a manufacturing process of the semiconductor device (formation of a polycrystalline silicon film 104) according to preferred embodiments of the present invention.

As shown in FIG. 10, a polycrystalline silicon film 104 is formed in a thickness of about 2,000 nm on a whole surface including the isolation trenches 103 by a CVD method. Accordingly, the polycrystalline silicon film 104 in the thickness of about 2,000 nm is formed on an inner side surface 103$is$ and an outer side surface 103$os$, respectively in the isolation trenches 103. Consequently, a gap 103$op_1$ of a width of about 1,000 nm remains in each isolation trench 103.

Figure 11:
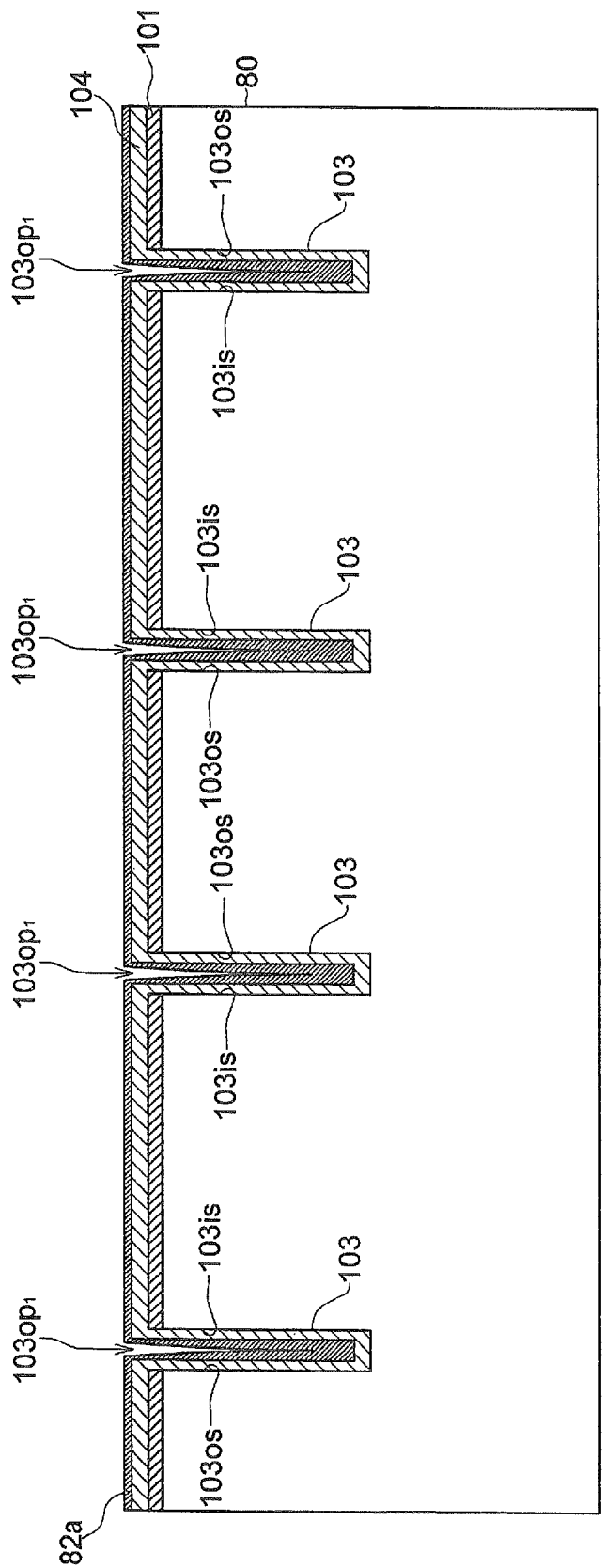
FIG. 11 is a partial cross-sectional view showing a schematic process diagram of a manufacturing process of the semiconductor device (formation of a silicon thermally-oxidized film 82*a*) according to preferred embodiments of the present invention.

Next, as shown in FIG. 11, a surface of the polycrystalline silicon film 104 is thermally oxidized, thereby forming a silicon thermally-oxidized film 82$a$ in a thickness of about 800 nm. A surface of the polycrystalline silicon film 104 is oxidized and is volumetrically expanded by the thermal oxidation. As a result, the silicon thermally-oxidized film 82$a$ becomes as shown in FIG. 11. That is, as shown in FIG. 11, a gap 103$op_2$ not filled by the polycrystalline silicon film 104 and the silicon thermally-oxidized film 82$a$ remains in the isolation trenches 103. In this case, because the silicon nitride film 101 remains on the surface of the silicon substrate 80, the surface of the silicon substrate 80 is prevented from being oxidized.

Figure 12:
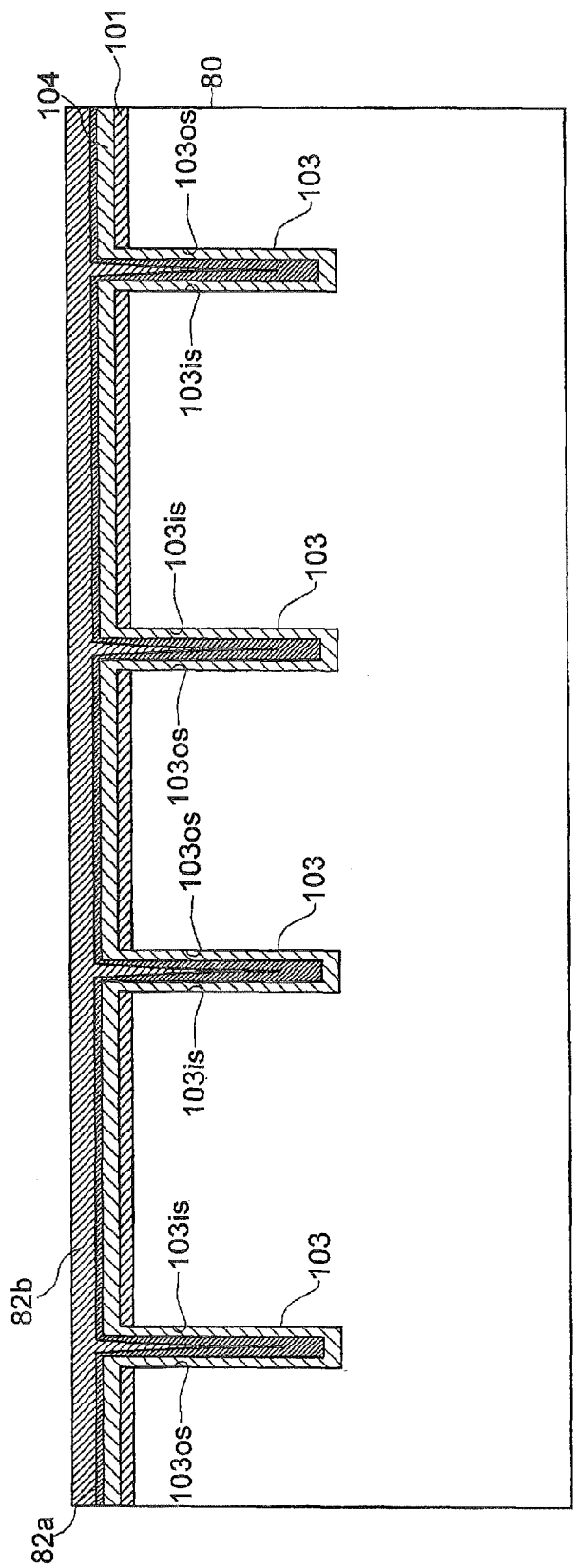
FIG. 12 is a partial cross-sectional view showing a schematic process diagram of a manufacturing process of the semiconductor device (formation of a CVD silicon oxide film 82*b*) according to preferred embodiments of the present invention.

Next, as shown in FIG. 12, a CVD silicon oxide film 82$b$ is formed on a whole surface to fill the gap 103$op_2$ by the CVD method.

Figure 13:
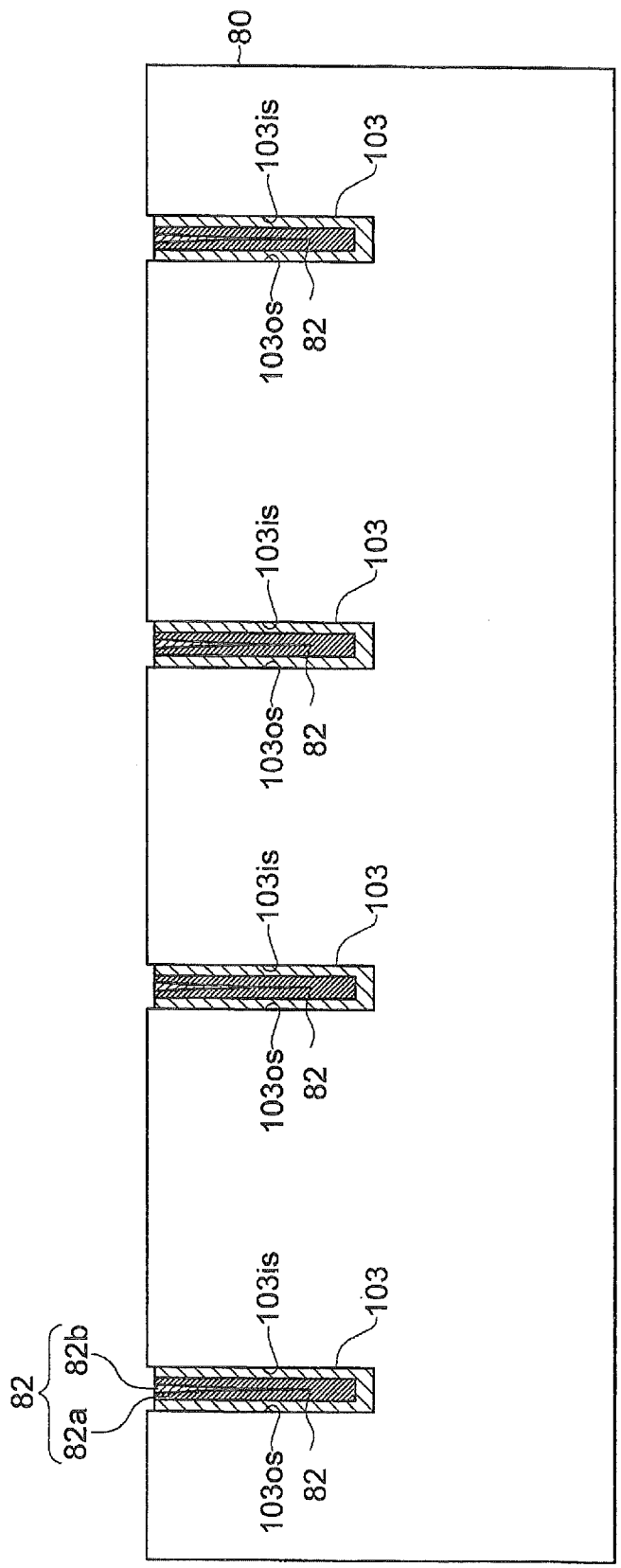
FIG. 13 is a partial cross-sectional view showing a schematic process diagram of a manufacturing process of the semiconductor device (removing of planarization of a CVD silicon oxide film 82*b*, a silicon thermally-oxidized film 82*a*, a polycrystalline silicon film 104, and a silicon nitride film 101) according to preferred embodiments of the present invention.

Thereafter, the CVD silicon oxide film 82$b$, the silicon thermally-oxidized film 82$a$, the polycrystalline silicon film 104, and the silicon nitride film 101 on the surface of the silicon substrate 80 are removed to planarize the surface, thereby obtaining a structure that the polycrystalline silicon film 104, the silicon thermally-oxidized film 82$a$, and the CVD silicon oxide film 82$b$ are embedded into the isolation trenches 103, as shown in FIG. 13. Accordingly, a ring-shaped isolation wall (the insulation ring) 82 including the silicon thermally-oxidized film 82$a$ and the CVD silicon oxide film 82$b$ is formed.

Figure 14:
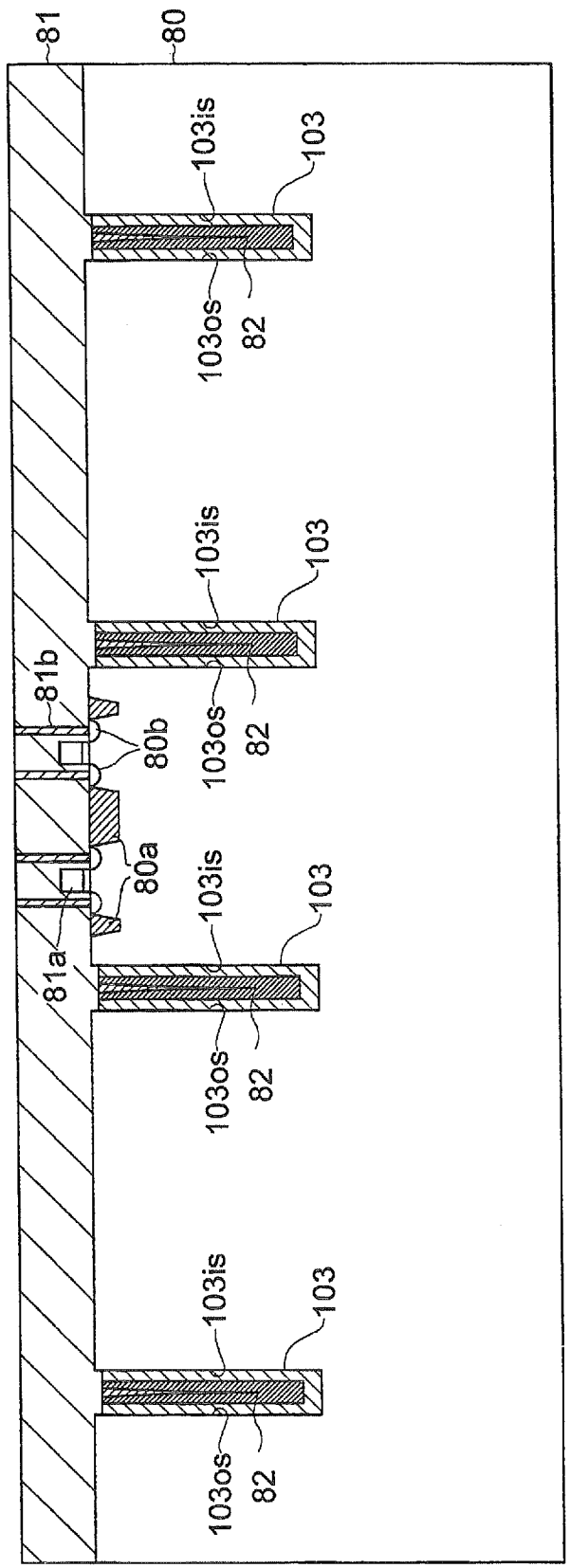
FIG. 14 is a partial cross-sectional view showing a schematic process diagram of a manufacturing process of the semiconductor device (formation of the STI 80*a*, the diffusion layer 80*b*, the interlayer dielectric film 81, the gate electrode 81*a*, and the through-hole electrode 81*b*) according to preferred embodiments of the present invention.

In this manner, after finishing a process up to that shown in FIG. 13, a normal element forming process of a semiconductor device is performed. As shown in FIG. 14, in the element forming process, the STI 80$a$ that becomes an element isolation region, the gate electrode 81$a$, the diffusion layer 80$b$, the interlayer dielectric film 81, the through-hole electrode 81$b$ and the like are formed.

Figure 15:
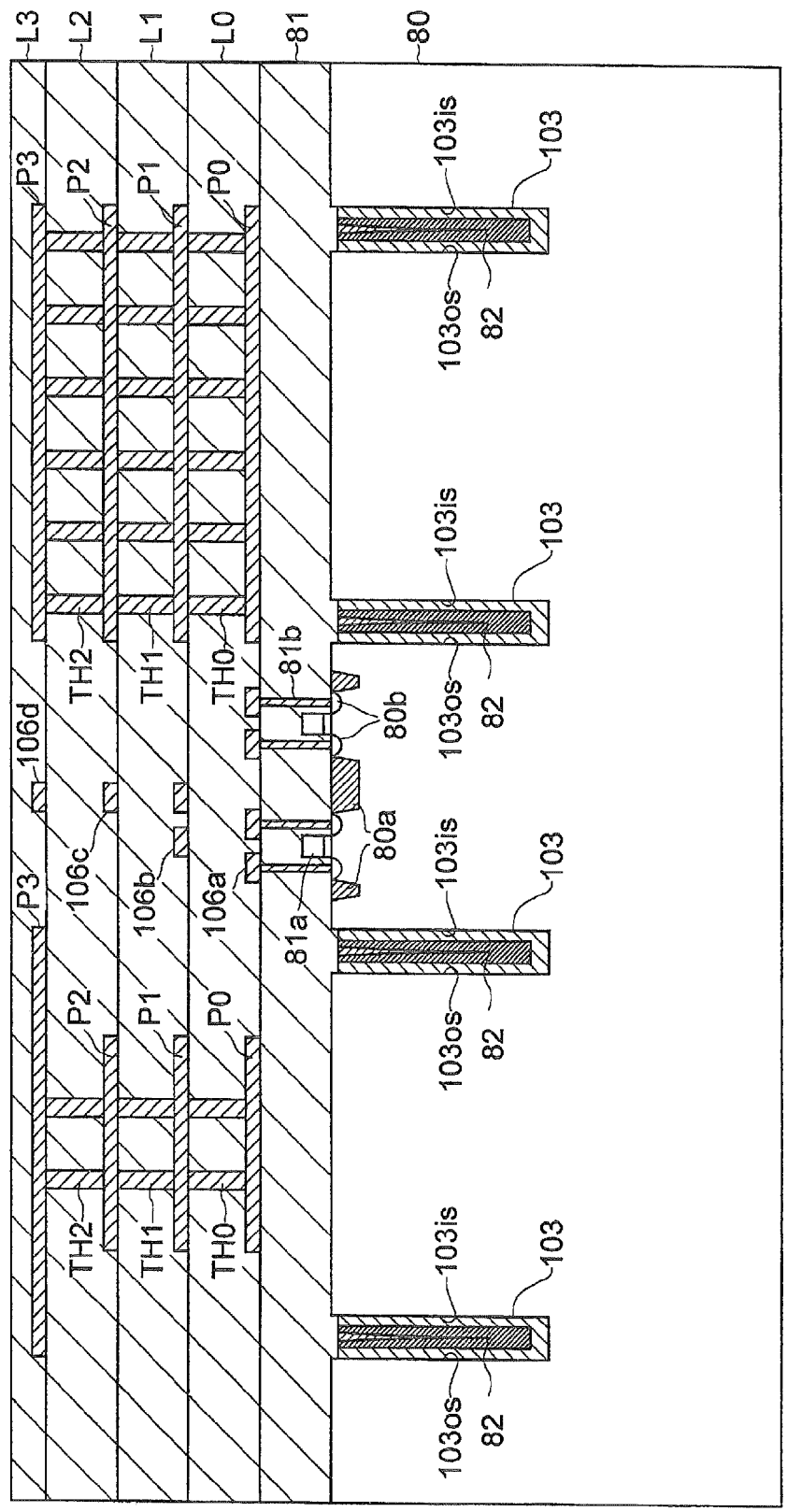
FIG. 15 is a partial cross-sectional view showing a schematic process diagram of a manufacturing process of the semiconductor device (formation of the wiring layers L0 to L3 and the pads P0 to P3) according to preferred embodiments of the present invention.

Next, as shown in FIG. 15, the wiring layers L0 to L3 are sequentially formed. When the first wiring layer L0 is formed, the pad P0 and a wiring 106$a$ are formed on a surface of the interlayer dielectric film 81, an interlayer dielectric film 107$a$ that covers the pad P0 and the wiring 106$a$ is formed, and then a through-hole electrode TH0 that penetrates the interlayer dielectric film 107$a$ is formed.

When the second wiring layer L1 is formed, the pad P1 and a wiring 106$b$ are formed on a surface of the interlayer dielectric film 107$a$, an interlayer dielectric film 107$b$ that covers the pad P1 and the wiring 106$b$ is formed, and then the through-hole electrode TH1 that penetrates the interlayer dielectric film 107$b$ is formed.

When the third wiring layer L2 is formed, the pad P2 and a wiring 106$c$ are formed on a surface of the interlayer dielectric film 107$b$, an interlayer dielectric film 107$c$ that covers the pad P2 and the wiring 106$c$ is formed, and then a through-hole electrode TH2 that penetrates the interlayer dielectric film 107$c$ is formed.

When the fourth wiring layer L3 is formed, the pad P3 and a wiring 106$d$ are formed on a surface of the interlayer dielectric film 107$c$, an interlayer dielectric film 107$d$ that covers the pad P3 and the wiring 106$d$ is formed. A through-hole electrode that penetrates the interlayer dielectric film 107$d$ is not formed here.

In the present embodiment, the wiring layer L0 is a tungsten wiring layer and the wiring layers L1 to L3 are aluminum wirings. Therefore, tungsten is used for a wiring material of the wiring layer L0 and aluminum is used for a wiring material of the wiring layers L1 to L3. The pads P0 to P3 formed on the wiring layers L0 to L3 are electrically connected to each other through the through-hole electrodes TH1 to TH3. Among the pads P0 to P2 formed on the wiring layers L0 to L2, sizes of the pads in the signal system are formed in relatively small sizes, and sizes of the pads in the power source system are formed in relatively large sizes. The numbers of the through-hole electrodes TH0 to TH2 are set to match sizes of the pads.

Figure 16:
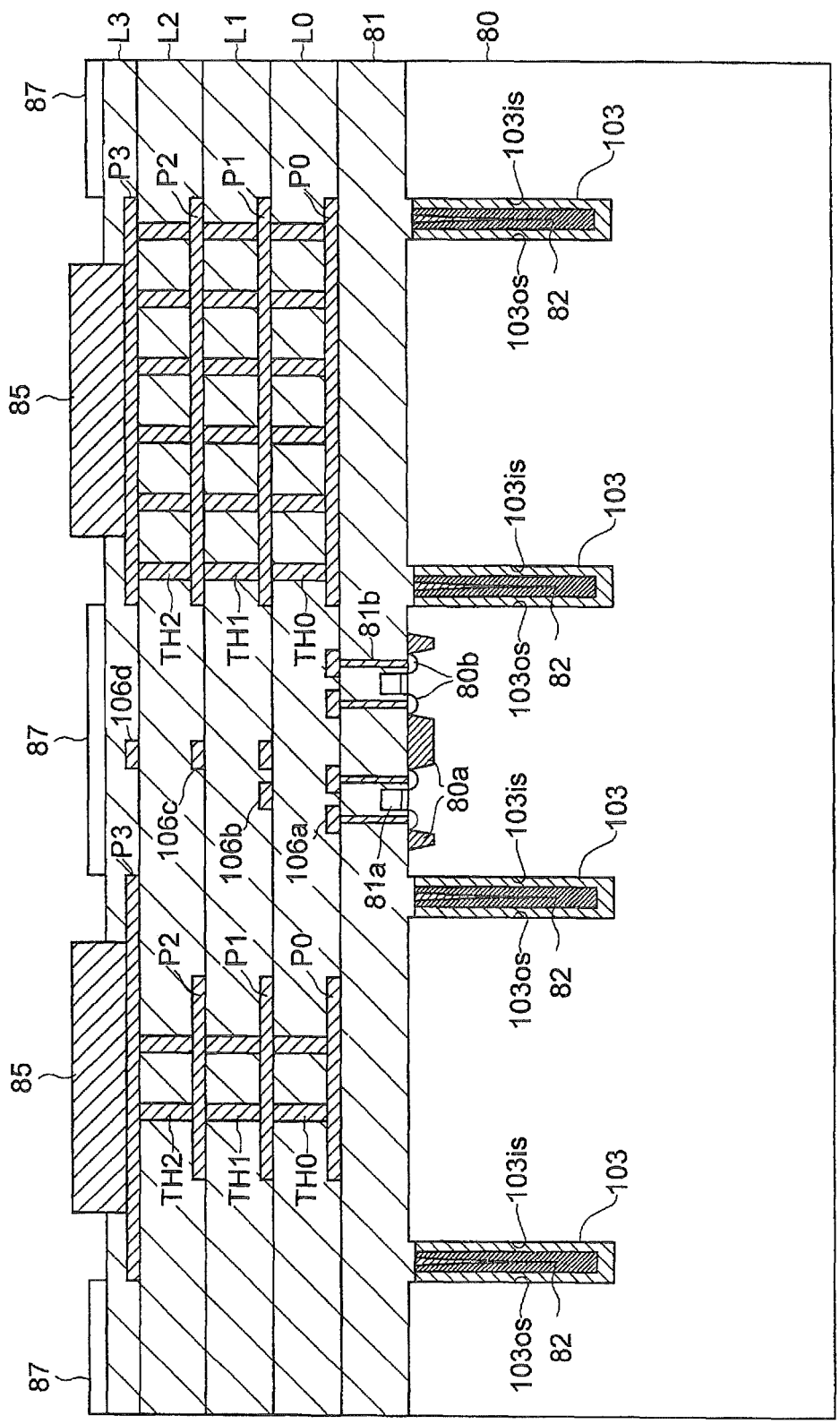
FIG. 16 is a partial cross-sectional view showing a schematic process diagram of a manufacturing process of the semiconductor device (formation of the upper surface bump and the cover layer 87) according to preferred embodiments of the present invention.

As shown in FIG. 16, the wiring layers L0 to L3 are formed first, the cover layer 87 including a SiON film is then formed on a whole surface of the interlayer dielectric film 107$d$ constituting the wiring layer L3, the cover layer 97 is then selectively removed, and a rectangular opening is formed above the pad P3. A part of the pad P3 is exposed by selectively removing the interlayer dielectric film of the wiring layer L3 in the opening, and the surface bump 85 is then formed on a surface of the pad P3 by sputtering. The manufacturing process at an upper side of the silicon substrate 80 is finished as described above.

A process at a back side of the silicon substrate 80 is proceeded as explained below.

Figure 17:
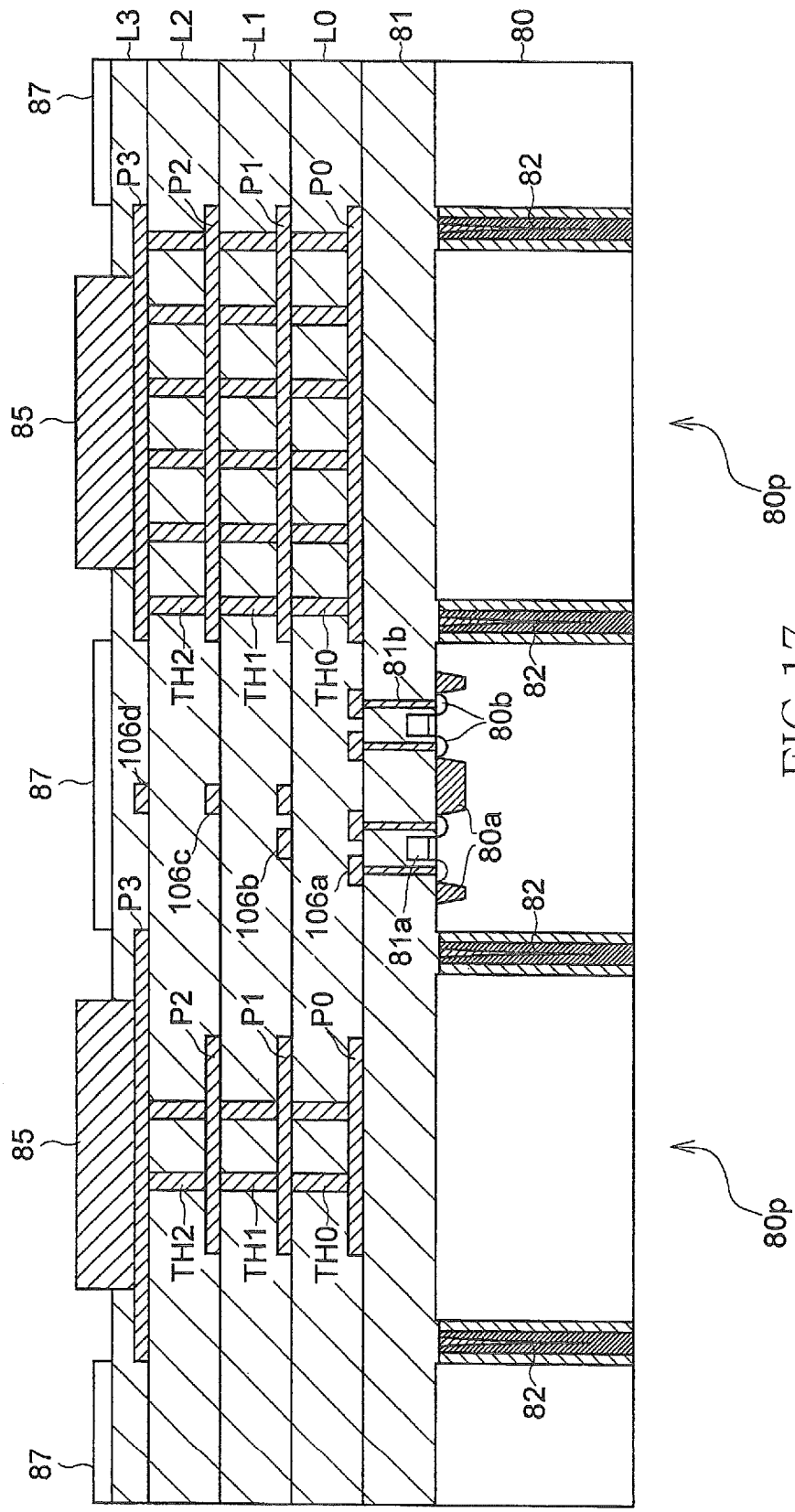
FIG. 17 is a partial cross-sectional view showing a schematic process diagram of a manufacturing process of the semiconductor device (polishing a back surface) according to preferred embodiments of the present invention.
Figure 18:
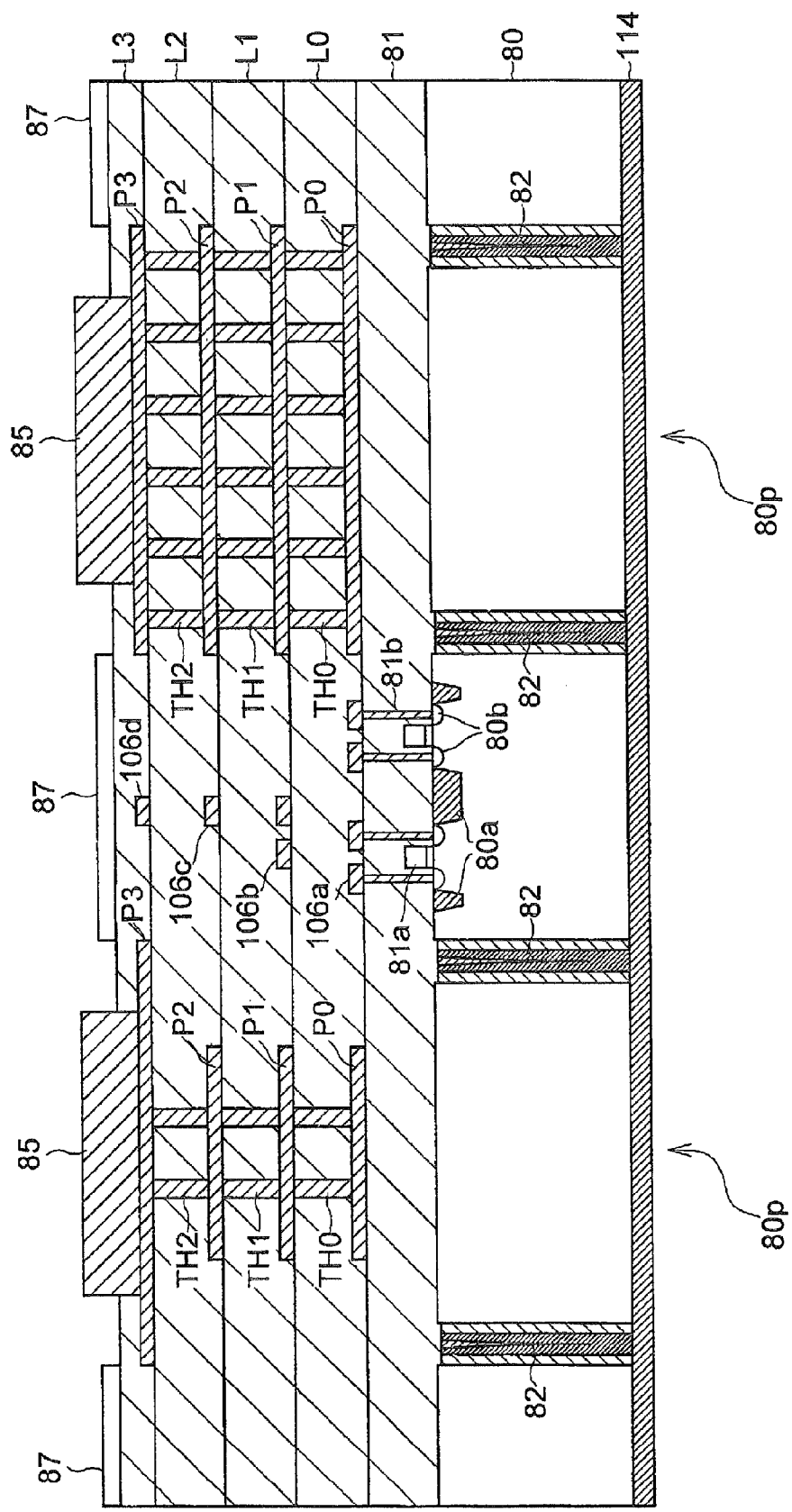
FIG. 18 is a partial cross-sectional view showing a schematic process diagram of a manufacturing process of the semiconductor device (formation of a back surface insulation film 114) according to preferred embodiments of the present invention.

First, as shown in FIG. 17, a back surface of the silicon substrate 80 is polished. The back surface is polished until when the isolation wall (the silicon oxide film) 82 is exposed after the polycrystalline silicon film 104 at a bottom of the isolation trench 103 is removed. As a result, as shown in FIG. 17, in the isolation trenches 103, the polycrystalline silicon film 104 is divided, a polycrystalline silicon film 104 remains on the inner side surface 103$is$ of the isolation trenches 103, and a polycrystalline silicon film 104$os$ remains on the outer side surface 103$os$ of the isolation trenches 103.

A TSV forming region 80$p$ surrounded by the ring-shaped isolation wall 82 is formed in this way.

Next, as shown in FIG. 18A, a back surface insulation film 114 that covers a back surface of the silicon substrate 80 (including the TSV forming region 80$p$) is formed.

Figure 19:
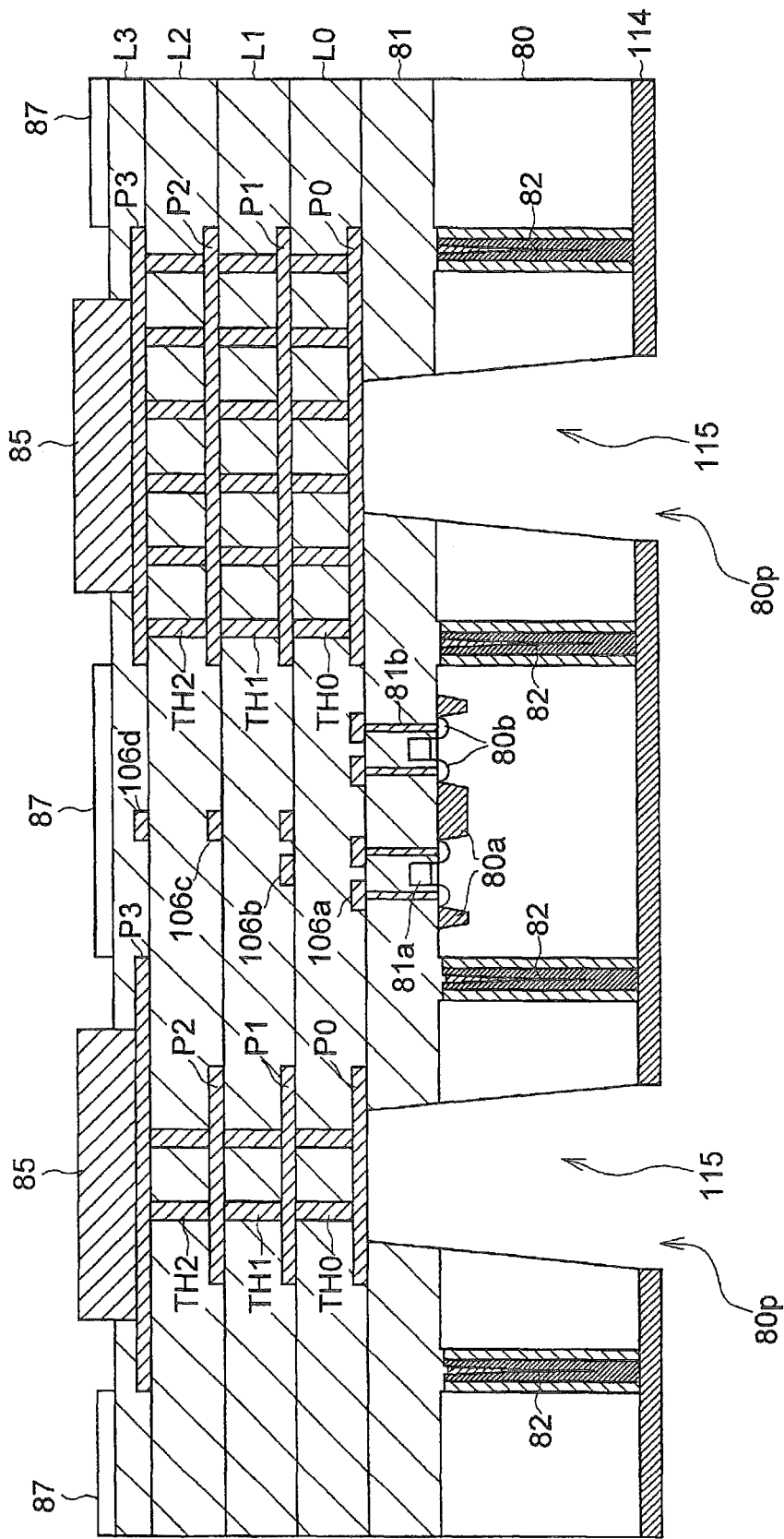
FIG. 19 is a partial cross-sectional view showing a schematic process diagram of a manufacturing process of the semiconductor device (formation of the opening 115) according to preferred embodiments of the present invention.

Next, as shown in FIG. 19, the opening 115 that penetrates the back surface insulation film 114, the silicon substrate 80, and the interlayer dielectric film 81 from the back surface of the silicon substrate 80, and has a lower surface of the pad P0 of the wiring layer exposed is formed in the TSV forming region 80$p$.

Figure 20:
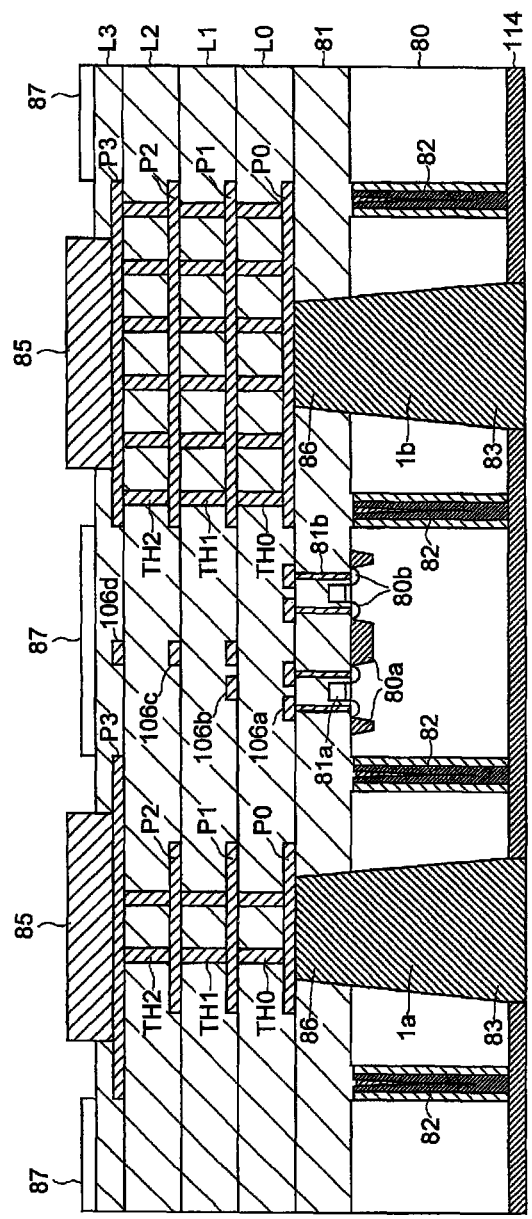
FIG. 20 is a partial cross-sectional view showing a schematic process diagram of a manufacturing process of the semiconductor device (formation of the TSV1) according to preferred embodiments of the present invention.

Next, as shown in FIG. 20, an electrode film is formed on a whole surface of the back surface to fill the opening 115, and this is patterned to form the TSV1$a$ and TSV1$b$. With this arrangement, the TSV1$a$ and TSV1$b$ surrounded by the isolation wall 82 are completed.

Thereafter, the back surface bump 84 is formed by sputtering on an exposed surface at one end of the TSV1$a$ and TSV1$b$, and the semiconductor device 10 shown in FIG. 8 is completed.

As explained above, according to the semiconductor device 10 of the present embodiment, the sizes of the pads P0 to P2 connected to the power-source system TSV1b are relatively large. Therefore, a capacitance component of the power-source system TSV1b can be obtained more than that of the signal system TSV1a, and the power source potential can be stabilized. Further, because the sizes of the pads P0 to P2 in the power source system are large, the number of the through-hole electrodes TH0 to TH2 provided between the pads can be larger than that in the signal system, and the parasitic resistance of the power-source system TSV can be smaller than that of the signal system. On the other hand, because the sizes of the pads P0 to P2 connected to the signal system TSV1a are relatively small, the capacitance component of the signal system TSV1a can be made smaller than that of the power-source system TSV1b. Accordingly, it is possible to prevent degradation of signal quality due to an increase in a parasitic capacitance.

Further, the semiconductor device 10 according to the present embodiment has the TSV1a and TSV1b that penetrate the element isolation layer as well as the semiconductor substrate, and the ends of the TSV1a and TSV1b are directly connected to the pad P0 in the wiring layer L0. Therefore, a conventional process of forming a connection electrode is not necessary. That is, a process of forming an opening in the interlayer dielectric film of the element forming layer by a process separate from that of forming a small through-hole to form an element and a process of embedding an electrode material into the opening are not necessary. Therefore, it is possible to achieve cost reduction by reducing the number of processes.

A specific circuit configuration of the semiconductor device 10 described above is explained below.

Figure 21:
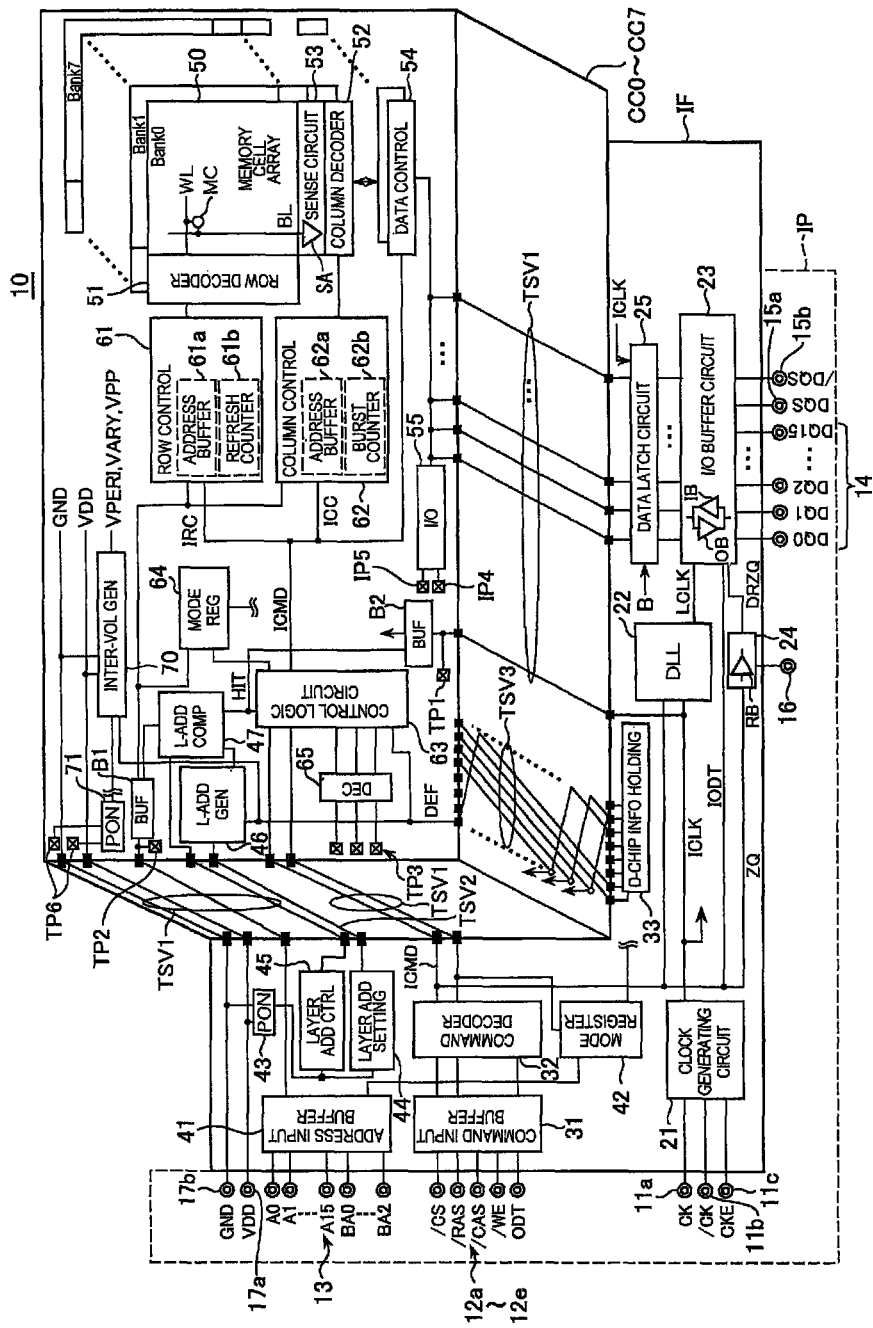
FIG. 21 is a block diagram illustrating the circuit configuration of the semiconductor device 10.

FIG. 21 is a block diagram illustrating the circuit configuration of the semiconductor device 10.

As shown in FIG. 21, the external terminals that are provided in the interposer IP include clock terminals 11a and 11b, an clock enable terminal 11c, command terminals 12a to 12e, an address terminal 13, a data input/output terminal 14, data strobe terminals 15a and 15b, a calibration terminal 16, and power supply terminals 17a and 17b. All of the external terminals are connected to the interface chip IF and are not directly connected to the core chips CC0 to CC7, except for the power supply terminals 17a and 17b.

First, a connection relationship between the external terminals and the interface chip IF performing the front end function and the circuit configuration of the interface chip IF will be described.

The clock terminals 11a and 11b are supplied with external clock signals CK and /CK, respectively, and the clock enable terminal 11c is supplied with a clock enable signal CKE. The external clock signals CK and /CK and the clock enable signal CKE are supplied to a clock generating circuit 21 provided in the interface chip IF. A signal where "/" is added to a head of a signal name in this specification indicates an inversion signal of a corresponding signal or a low-active signal. Accordingly, the external clock signals CK and /CK are complementary signals. The clock generating circuit 21 generates an internal clock signal ICLK, and the generated internal clock signal ICLK is supplied to various circuit blocks in the interface chip IF and is commonly supplied to the core chips CC0 to CC7 through the TSVs.

A DLL circuit 22 is included in the interface chip IF and an input/output clock signal LCLK is generated by the DLL circuit 22. The input/output clock signal LCLK is supplied to an input/output buffer circuit 23 included in the interface chip IF. A DLL function is used to control the front end unit by using the signal LCLK synchronized with a signal of the external device, when the semiconductor device 10 communicates with the external device. Accordingly, DLL function is not needed for the core chips CC0 to CC7 as the back end.

The command terminals 12a to 12e are supplied with a row-address strobe signal /RAS, a column address strobe signal /CAS, a write enable signal /WE, a chip select signal /CS, and an on-die termination signal ODT. These command signals are supplied to a command input buffer 31 that is provided in the interface chip IF. The command signals supplied to the command input buffer 31 are further supplied to a command decoder 32. The command decoder 32 is a circuit that holds, decodes, and counts the command signals in synchronization with the internal clock ICLK and generates various internal commands ICMD. The generated internal command ICMD is supplied to the various circuit blocks in the interface chip IF and is commonly supplied to the core chips CC0 to CC7 through the TSVs.

The address terminal 13 is a terminal to which address signals A0 to A15 and BA0 to BA2 are supplied, and the supplied address signals A0 to A15 and BA0 to BA2 are supplied to an address input buffer 41 provided in the interface chip IF. An output of the address input buffer 41 is commonly supplied to the core chips CC0 to CC7 through the TSVs. The address signals A0 to A15 are supplied to a mode register 42 provided in the interface chip IF, when the semiconductor device 10 enters a mode register set. The address signals BA0 to BA2 (bank addresses) are decoded by an address decoder (not shown in the drawings) provided in the interface chip IF, and a bank selection signal B that is obtained by the decoding is supplied to a data latch circuit 25. This is because bank selection of the write data is performed in the interface chip IF.

The data input/output terminal 14 is used to input/output read data or write data DQ0 to DQ15. The data strobe terminals 15a and 15b are terminals that are used to input/output strobe signals DQS and /DQS. The data input/output terminal 14 and the data strobe terminals 15a and 15b are connected to the input/output buffer circuit 23 provided in the interface chip IF. The input/output buffer circuit 23 includes an input buffer IB and an output buffer OB, and inputs/outputs the read data or the write data DQ0 to DQ15 and the strobe signals DQS and /DQS in synchronization with the input/output clock signal LCLK supplied from the DLL circuit 22. If an internal on-die termination signal IODT is supplied from the command decoder 32, the input/output buffer circuit 23 causes the output buffer OB to function as a termination resistor. An impedance code DRZQ is supplied from the calibration circuit 24 to the input/output buffer circuit 23. Thereby, impedance of the output buffer OB is designated. The input/output buffer circuit 23 includes a well-known FIFO circuit.

The calibration circuit 24 includes a replica buffer RB that has the same circuit configuration as the output buffer OB. If the calibration signal ZQ is supplied from the command decoder 32, the calibration circuit 24 refers to a resistance value of an external resistor (not shown in the drawings) connected to the calibration terminal 16 and performs a calibration operation. The calibration operation is an operation for matching the impedance of the replica buffer RB with the resistance value of the external resistor, and the obtained impedance code DRZQ is supplied to the input/output buffer circuit 23. Thereby, the impedance of the output buffer OB is adjusted to a desired value.

The input/output buffer circuit 23 is connected to a data latch circuit 25. The data latch circuit 25 includes a FIFO circuit (not shown in the drawings) that realizes a FIFO function which operates by latency control realizing the well-known DDR function and a multiplexer MUX (not shown in the drawings). The input/output buffer circuit 23 converts parallel read data, which is supplied from the core chips CC0 to CC7, into serial read data, and converts serial write data, which is supplied from the input/output buffer, into parallel write data. Accordingly, the data latch circuit 25 and the input/output buffer circuit 23 are connected in serial and the data latch circuit 25 and the core chips CC0 to CC7 are connected in parallel. In this embodiment, each of the core chips CC0 to CC7 is the back end unit of the DDR3-type SDRAM and a prefetch number is 8 bits. The data latch circuit 25 and each banks of the core chips CC0 to CC7 are connected respectively, and the number of banks that are included in each of the core chips CC0 to CC7 is 8. Accordingly, connection of the data latch circuit 25 and the core chips CC0 to CC7 becomes 64 bits (8 bits×8 banks) for each DQ.

Parallel data, not converted into serial data, is basically transferred between the data latch circuit 25 and the core chips CC0 to CC7. That is, in a common SDRAM (in the SDRAM, a front end unit and a back end unit are constructed in one chip), between the outside of the chip and the SDRAM, data is input/output in serial (that is, the number of data input/output terminals is one for each DQ). However, in the core chips CC0 to CC7, an input/output of data between the interface chip IF and the core chips is performed in parallel. This point is the important difference between the common SDRAM and the core chips CC0 to CC7. However, all of the prefetched parallel data do not need to be input/output using the different TSVs, and partial parallel/serial conversion may be performed in the core chips CC0 to CC7 and the number of TSVs that are needed for each DQ may be reduced. For example, all of data of 64 bits for each DQ do not need to be input/output using the different TSVs, and 2-bit parallel/serial conversion may be performed in the core chips CC0 to CC7 and the number of TSVs that are needed for each DQ may be reduced to ½ (32).

To the data latch circuit 25, a function for enabling a test in an interface chip unit is added. The interface chip does not have the back end unit. For this reason, the interface chip cannot be operated as a single chip in principle. However, if the interface chip never operates as the single chip, an operation test of the interface chip in a wafer state may not be performed. This means that the semiconductor device 10 cannot be tested in case an assembly process of the interface chip and the plural core chips is not executed, and the interface chip is tested by testing the semiconductor device 10. In this case, when a defect that cannot be recovered exists in the interface chip, the entire semiconductor device 10 is not available. In consideration of this point, in this embodiment, a portion of a pseudo back end unit for a test is provided in the data latch circuit 25, and a simple memory function is enabled at the time of a test.

The power supply terminals 17a and 17b are terminals to which power supply potentials VDD and VSS are supplied, respectively. The power supply terminals 17a and 17b are connected to a power-on detecting circuit 43 provided in the interface chip IF and are also connected to the core chips CC0 to CC7 through the TSVs. The power-on detecting circuit 43 detects the supply of power. On detecting the supply of power, the power-on detecting circuit 43 activates a layer address control circuit 45 on the interface chip IF.

The layer address control circuit 45 changes a layer address due to the I/O configuration of the semiconductor device 10 according to the present embodiment. As described above, the semiconductor device 10 includes 16 data input/output terminals 14. Thereby, a maximum I/O number can be set to 16 bits (DQ0 to DQ15). However, the I/O number is not fixed to 16 bits and may be set to 8 bits (DQ0 to DQ7) or 4 bits (DQ0 to DQ3). The address allocation is changed according to the I/O number and the layer address is also changed. The layer address control circuit 45 changes the address allocation according to the I/O number and is commonly connected to the core chips CC0 to CC7 through the TSVs.

The interface chip IF is also provided with a layer address setting circuit 44. The layer address setting circuit 44 is connected to the core chips CC0 to CC7 through the TSVs. The layer address setting circuit 44 is cascade-connected to the layer address generating circuit 46 of the core chips CC0 to CC7 using the TSV2 of the type shown in FIG. 2B, and reads out the layer addresses set to the core chips CC0 to CC7 at testing.

The interface chip IF is also provided with a defective chip information holding circuit 33. When a defective core chip that does not normally operates is discovered after an assembly, the defective chip information holding circuit 33 holds its chip number. The defective chip information holding circuit 33 is connected to the core chips CC0 to CC7 through the TSVs. The defective chip information holding circuit 33 is connected to the core chips CC0 to CC7 while being shifted, using the TSV3 of the type shown in FIG. 2C.

The above description is the outline of the connection relationship between the external terminals and the interface chip IF and the circuit configuration of the interface chip IF. Next, the circuit configuration of the core chips CC0 to CC7 will be described.

As shown in FIG. 21, memory cell arrays 50 that are included in the core chips CC0 to CC7 performing the back end function are divided into eight banks. A bank is a unit that can individually receive a command. That is, the individual banks can be independently and nonexclusively controlled. From the outside of the semiconductor device 10, each back can be independently accessed. For example, a part of the memory cell array 50 belonging to the bank 1 and another part of the memory cell array 50 belonging to the bank 2 are controlled nonexclusively. That is, word lines WL and bit lines BL corresponding to each banks respectively are independently accessed at same period by different commands one another. For example, while the bank 1 is maintained to be active (the word lines and the bit lines are controlled to be active), the bank 2 can be controlled to be active. However, the external terminals (for example, plural control terminals and plural I/O terminals) of the semiconductor device 10 are shared. In the memory cell array 50, the plural word lines WL and the plural bit lines BL intersect each other, and memory cells MC are disposed at intersections thereof (in FIG. 22, only one word line WL, one bit line BL, and one memory cell MC are shown). The word line WL is selected by a row decoder 51. The bit line BL is connected to a corresponding sense amplifier SA in a sense circuit 53. The sense amplifier SA is selected by a column decoder 52.

The row decoder 51 is controlled by a row address supplied from a row control circuit 61. The row control circuit 61 includes an address buffer 61a that receives a row address supplied from the interface chip IF through the TSV, and the row address that is buffered by the address buffer 61a is supplied to the row decoder 51. The address signal that is supplied through the TSV is supplied to the row control circuit 61 through the input buffer B1. The row control circuit 61 also includes a refresh counter 61b. When a refresh signal is issued by a control logic circuit 63, a row address that is indicated by the refresh counter 61b is supplied to the row decoder 51.

The column decoder 52 is controlled by a column address supplied from a column control circuit 62. The column control circuit 62 includes an address buffer 62a that receives the column address supplied from the interface chip IF through the TSV, and the column address that is buffered by the address buffer 62a is supplied to the column decoder 52. The column control circuit 62 also includes a burst counter 62b that counts the burst length.

The sense amplifier SA selected by the column decoder 52 is connected to the data control circuit 54 through some amplifiers (sub-amplifiers or data amplifiers or the like) which are not shown in the drawings. Thereby, read data of 8 bits (=prefetch number) for each I/O (DQ) is output from the data control circuit 54 at reading, and write data of 8 bits is input to the data control circuit 54 at writing. The data control circuit 54 and the interface chip IF are connected in parallel through the TSV.

The control logic circuit 63 receives an internal command ICMD supplied from the interface chip IF through the TSV and controls the row control circuit 61 and the column control circuit 62, based on the internal command ICMD. The control logic circuit 63 is connected to a layer address comparing circuit (chip information comparing circuit) 47. The layer address comparing circuit 47 detects whether the corresponding core chip is target of access, and the detection is performed by comparing a SEL (chip selection information) which is a part of the address signal supplied from the interface chip IF through the TSV and a layer address LID (chip identification information) set to the layer address generating circuit 46.

In the layer address generating circuit 46, unique layer addresses are set to the core chips CC0 to CC7, respectively, at initialization. A method of setting the layer addresses is as follows. First, after the semiconductor device 10 is initialized, a minimum value (0, 0, 0) as an initial value is set to the layer address generating circuits 46 of the core chips CC0 to CC7. The layer address generating circuits 46 of the core chips CC0 to CC7 are cascade-connected using the TSVs of the type shown in FIG. 2B, and have increment circuits provided therein. The layer address (0, 0, 0) that is set to the layer address generating circuit 46 of the core chip CC0 of the uppermost layer is transmitted to the layer address generating circuit 46 of the second core chip CC1 through the TSV and is incremented. As a result, a different layer address (0, 0, 1) is generated. Hereinafter, in the same way as the above case, the generated layer addresses are transmitted to the core chips of the lower layers and the layer address generating circuits 46 in the core chips increment the transmitted layer addresses. A maximum value (1, 1, 1) as a layer address is set to the layer address generating circuit 46 of the core chip CC7 of the lowermost layer. Thereby, the unique layer addresses are set to the core chips CC0 to CC7, respectively.

The layer address generating circuit 46 is provided with a defective chip signal DEF supplied from the defective chip information holding circuit 33 of the interface chip IF, through the TSV. As the defective chip signal DEF is supplied to the individual core chips CC0 to CC7 using the TSV3 of the type shown in FIG. 2C, the defective chip signals DEF can be supplied to the core chips CC0 to CC7, individually. The defective chip signal DEF is activated when the corresponding core chip is a defective chip. When the defective chip signal DEF is activated, the layer address generating circuit 46 transmits, to the core chip of the lower layer, a non-incremented layer address, not an incremented layer address. The defective chip signal DEF is also supplied to the control logic circuit 63. When the defective chip signal DEF is activated, the control logic circuit 63 is completely halted. Thereby, the defective core chip performs neither read operation nor write operation, even though an address signal or a command signal is input from the interface chip IF.

An output of the control logic circuit 63 is also supplied to a mode register 64. When an output of the control logic circuit 63 shows a mode register set, the mode register 64 is updated by an address signal. Thereby, operation modes of the core chips CC0 to CC7 are set.

Each of the core chips CC0 to CC7 has an internal voltage generating circuit 70. The internal voltage generating circuit 70 is provided with power supply potentials VDD and VSS. The internal voltage generating circuit 70 receives these power supply potentials and generates various internal voltages. As the internal voltages that are generated by the internal voltage generating circuit 70, an internal voltage VPERI (≈VDD) for operation power of various peripheral circuits, an internal voltage VARY (<VDD) for an array voltage of the memory cell array 50, and an internal voltage VPP (>VDD) for an activation potential of the word line WL are included. In each of the core chips CC0 to CC7, a power-on detecting circuit 71 is also provided. When the supply of power is detected, the power-on detecting circuit 71 resets various internal circuits.

The peripheral circuits in the core chips CC0 to CC7 operates in synchronization with the internal clock signal ICLK that is supplied form the interface chip IF through the TSV. The internal clock signal ICLK supplied through the TSV is supplied to the various peripheral circuits through the input buffer B2.

The above description is the basic circuit configuration of the core chips CC0 to CC7. In the core chips CC0 to CC7, the front end unit for an interface with the external device is not provided. Therefore the core chip cannot operate as a single chip in principle. However, if the core chip never operates as the single chip, an operation test of the core chip in a wafer state may not be performed. This means that the semiconductor device 10 cannot be tested, before the interface chip and the plural core chips are fully assembled. In other words, the individual core chips are tested when testing the semiconductor device 10. When unrecoverable defect exists in the core chips, the entire semiconductor device 10 is led to be unavailable. In this embodiment, in the core chips CC0 to CC7, a portion of a pseudo front end unit, for testing, that includes some test pads TP and a test front end unit of a test command decoder 65 is provided, and an address signal and test data or a command signal can be input from the test pads TP. It is noted that the test front end unit is provided for a simple test in a wafer test, and does not have all of the front end functions in the interface chip. For example, since an operation frequency of the core chips is lower than an operation frequency of the front end unit, the test front end unit can be simply realized with a circuit that performs a test with a low frequency.

Kinds of the test pads TP are almost the same as those of the external terminals provided in the interposer IP. Specifically, the test pads include a test pad TP1 to which a clock signal is input, a test pad TP2 to which an address signal is input, a test pad TP3 to which a command signal is input, a test pad TP4 for input/output test data, a test pad TP5 for input/output a data strobe signal, and a test pad TP6 for a power supply potential.

A common external command (not decoded) is input at testing. Therefore, the test command decoder 65 is also provided in each of the core chips CC0 to CC7. Because serial test data is input and output at testing, a test input/output circuit 55 is also provided in each of the core chips CC0 to CC7.

This is the entire configuration of the semiconductor device 10. Because in the semiconductor device 10, the 8 core chips of 1 Gb are laminated, the semiconductor device 10 has a memory capacity of 8 Gb in total. Because the chip selection signal /CS is input to one terminal (chip selection terminal), the semiconductor device is recognized as a single DRAM having the memory capacity of 8 Gb, in view of the controller.

Figure 22:
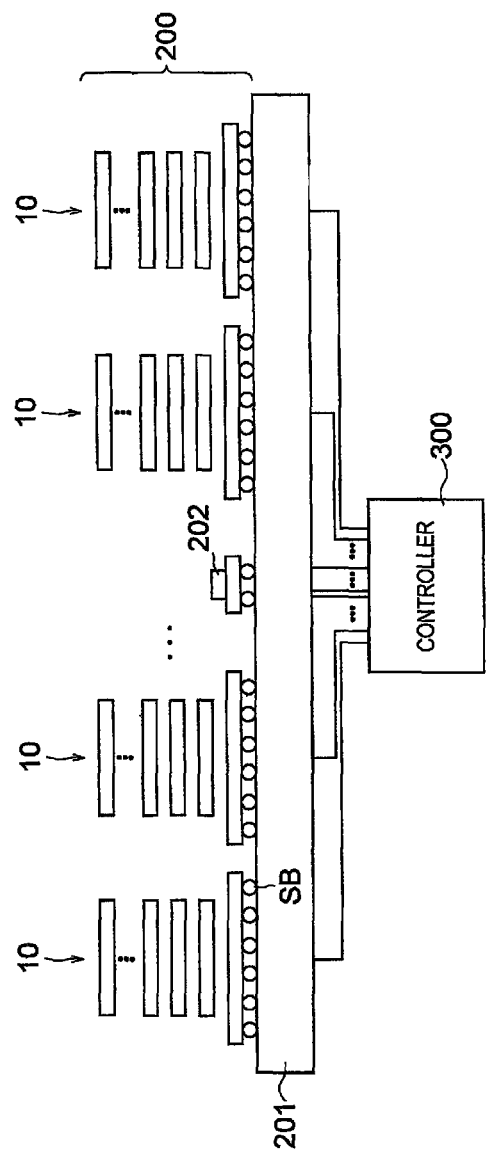
FIG. 22 is a diagram showing the configuration of a data processing system using the semiconductor device 10.

FIG. 22 is a diagram showing the configuration of a data processing system using the semiconductor device 10 according to this embodiment.

The data processing system shown in FIG. 22 includes a memory module 100 and a controller 200 connected to the memory module 100. In the memory module 100, the plural semiconductor devices 10 are mounted on a module substrate 101. A register 102 that receives an address signal or a command signal supplied from the controller 200 is mounted on the module substrate 101, and the address signal or the command signal is supplied to each semiconductor device 10 through the register 102.

In the data processing system that has the above configuration, the controller 200 may supply only various signals, such as the address signals or the command signals, which are needed for an access of a common DRAM, and does not need to supply a special signal, such as a chip selection address, which is not used in the common DRAM.

It is apparent that the present invention is not limited to the above embodiments, but may be modified and changed without departing from the scope and spirit of the invention.

For example, in the above embodiment, although the signal system TSV and the power-source system TSV have the same diameters, the power-source system TSV can have a larger diameter than that of the signal system TSV. In this case, the parasitic capacitance of the power-source system TSV becomes large and the parasitic resistance of the power-source system TSV becomes small. Therefore, it is possible to achieve stability of power source potential and reduction of power consumption.

For example, in the above described embodiment, the DDR3-type SDRAM is used as the core chip, but the present invention is not limited thereto. Accordingly, the core chip may be a DRAM other than the DDR3-type and may be a semiconductor memory (SRAM, PRAM, MRAM, flash memory, etc.) other than the DRAM. All of the core chips do not need to be laminated and all or part of the core chips may be two-dimensionally disposed. The number of core chips is not restricted to 8.

Furthermore, the present invention can be also applied to semiconductor devices other than semiconductor memories. For example, it is possible that a CPU (Central Processing Unit) is mounted on an interface chip, a cache memory of the CPU is mounted on a core chip, and the interface chip and plural core chips are combined to constitute a high-performance CPU. Further, it is also possible that a CPU, a GPU (Graphics Processing Unit) SDRAM, and a flash memory are prepared as core chips, chip sets of these core chips are prepared as interface chips, and these are constituted as a chip-stacked semiconductor device, thereby realizing a one-chip computer.

What is claimed is:

1. A device manufacturing method comprising:
providing a semiconductor substrate;
forming first and second penetration electrodes each penetrating the semiconductor substrate;
forming a multi-level wiring structure on the semiconductor substrate, the multi-level wiring structure comprising a lower-level wiring, an upper-level wiring and an interlayer insulating film between the lower-level wiring and the upper-level wiring;
forming a first wiring pad as the lower-level wiring, the first wiring pad being electrically connected to the first penetration electrode;
forming a second wiring pad formed as the upper-level wiring;
forming a plurality of first through electrodes in the interlayer insulating film to make an electrical connection between the first and second wiring pads;
forming a third wiring pad formed as the lower-level wiring, the third wiring being electrically connected to the second penetration electrode;
forming a fourth wiring pad as the upper-level wiring; and
forming a plurality of second through electrodes in the interlayer insulating film to make an electrical connection between the third and fourth wiring pads,
wherein a number of the first through electrodes is greater than a number of the second through electrodes.

2. The device manufacturing method as claimed in claim 1, wherein a size of the first penetration electrode is substantially the same as a size of the second penetration electrode.

3. The device manufacturing method as claimed in claim 1, wherein the first penetration electrode is configured to be supplied with a power source voltage and the second penetration electrode is configured to be supplied with a signal.

4. The device manufacturing method as claimed in claim 3, wherein the first wiring pad is greater in size than the third wiring pad.

5. The device manufacturing method as claimed in claim 4, wherein the second wiring pad is greater in size than the fourth wiring pad.

6. The device manufacturing method as claimed in claim 3, wherein the first wiring pad is greater in size than the second wiring pad.

7. The device manufacturing method as claimed in claim 1, wherein the first and second penetration electrodes are coupled to the first and third wiring pads at top surfaces thereof, respectively, and the device manufacturing method further comprising:
forming a first bump connected to a bottom surface of the first penetration electrode; and
forming a second bump connected to a bottom surface of the second penetration electrode, a size of the second bump being substantially the same as a size of the first bump.

8. The device manufacturing method as claimed in claim 7, wherein each of the second and fourth wiring pads is formed as a top-level wiring of the multi-level wiring structure, and the device manufacturing method further comprising:
forming a third bump on the second wiring pad; and
forming a fourth bump on the fourth wiring pad, a size of the fourth bump being substantially the same as a size of the third bump.

9. The device manufacturing method as claimed in claim 1, wherein the device comprises a power source system and a signal system, and the forming of the first penetration electrode comprises forming the first penetration electrode in the power source system and the forming of the second penetration electrode comprises forming the second penetration electrode in the signal system.

10. A method of forming a semiconductor device, comprising:
forming first and second bumps on a semiconductor substrate;
forming first and second penetration electrodes penetrating the semiconductor substrate;

forming a first conductive structure making a first electrical path between the first bump and the first penetration electrode; and forming a second conductive structure making a second electrical path between the second bump and the second penetration electrode, the second conductive structure being smaller in resistance value than the first conductive structure.

11. The method of forming a semiconductor device as claimed in claim 10, wherein the first and second bumps are substantially the same in size as each other.

12. The method of forming a semiconductor device as claimed in claim 11, wherein a size of the first penetration electrode is the same as a size of the second penetration electrode.

13. The method of forming a semiconductor device as claimed in claim 10, wherein the first conductive structure further includes a plurality of first pads stacked with one another such that vertically adjacent two of the first pads are connected via at least one first through electrode and the second conductive structure further includes a plurality of second pads stacked with one another such that vertically adjacent two of the second pads are connected via at least one second through electrode and at least one of the second pads is larger in size than at least one of the first pads.

14. The method of forming a semiconductor device as claimed in claim 10, further comprising a plurality of transistors provided on the semiconductor substrate.

15. A method of forming a semiconductor device, comprising:

forming first and second penetration electrodes in a semiconductor substrate and penetrating the semiconductor substrate; and forming first and second wiring pads respectively connected to the first and second penetration electrodes, wherein a size of the first penetration electrode is substantially the same as a size of the second penetration electrode, and a size of the first wiring pad is different from a size of second wiring pad.

16. The method of forming a semiconductor device as claimed in claim 15, wherein the first and second penetration electrodes are coupled to the first and second wiring pads at top surfaces thereof, respectively, and wherein the semiconductor device further comprises:

a first bump connected to a bottom surface of the first penetration electrode; and a second bump connected to a bottom surface of the second penetration electrode, the second bump being substantially the same in size as the first bump.

* * * * *